US007201817B2

(12) United States Patent
Srinivasan

(10) Patent No.: US 7,201,817 B2
(45) Date of Patent: Apr. 10, 2007

(54) MAGNETOELECTRIC MULTILAYER COMPOSITES FOR FIELD CONVERSION

(75) Inventor: Gopalan Srinivasan, Rochester, MI (US)

(73) Assignee: Oakland University, Rochester, MI (US)

(*) Notice: Subject to any disclaimer, the term of this patent is extended or adjusted under 35 U.S.C. 154(b) by 255 days.

(21) Appl. No.: 10/940,139

(22) Filed: Sep. 14, 2004

(65) Prior Publication Data

US 2005/0104474 A1 May 19, 2005

Related U.S. Application Data

(62) Division of application No. 10/125,670, filed on Apr. 18, 2002, now Pat. No. 6,835,463.

(51) Int. Cl.
*C03B 29/00* (2006.01)
*H02N 2/00* (2006.01)

(52) U.S. Cl. ................ 156/89.12; 156/89.14; 310/311

(58) Field of Classification Search ........... 156/89.12, 156/89.14
See application file for complete search history.

(56) References Cited

U.S. PATENT DOCUMENTS

| 3,977,887 | A | * | 8/1976 | McIntosh .................. 501/134 |
| 4,769,599 | A | | 9/1988 | Mermelstein |
| 5,130,654 | A | | 7/1992 | Mermelstein |
| 5,390,142 | A | | 2/1995 | Gendlin |
| 5,512,196 | A | | 4/1996 | Mantese et al. |
| 5,675,252 | A | * | 10/1997 | Podney .................... 324/244 |
| 5,774,025 | A | * | 6/1998 | Adam et al. ............... 333/24.1 |
| 6,094,111 | A | * | 7/2000 | Sunahara .................. 333/184 |
| 6,162,311 | A | * | 12/2000 | Gordon et al. ............ 156/89.11 |
| 6,279,406 | B1 | | 8/2001 | Li et al. |
| 6,306,511 | B1 | * | 10/2001 | Nakao et al. ............... 428/426 |
| 2001/0028245 | A1 | | 10/2001 | Li et al. |
| 2001/0040450 | A1 | | 11/2001 | Li et al. |
| 2002/0114962 | A1 | * | 8/2002 | Kawasaki et al. .......... 428/469 |

OTHER PUBLICATIONS

A. Tawfik, "Electromechanical properties of Co(o.6)Zn(0.4)Fe(2)O(4) ferrite transducer," Journal of Magnetism and Magnetic Materials 237 (2001) 283-287.*

P.G. Bercoff and H.R. Bertorello, "Localized canting effect in Zn-substituted Ni Ferrites," Journal of Magnetism and Magnetic Materials 213 (2000) 56-62.*

(Continued)

*Primary Examiner*—Melvin Mayes
(74) *Attorney, Agent, or Firm*—Ian C. McLeod; Steven E. Merritt

(57) ABSTRACT

Magnetoelectric multilayer composites comprising alternate layers of a bimetal ferrite wherein one of the metals is zinc and a piezoelectric material for facilitating conversion of an electric field into a magnetic field or vice versa. The preferred composites include cobalt, nickel, or lithium zinc ferrite and PZT films which are arranged in a bilayer or in alternating layers, laminated, and sintered at high temperature. The composites are useful in sensors for detection of magnetic fields (10); sensors for measuring rotation speed, linear speed, or acceleration; read-heads in storage devices by converting bits in magnetic storage devices to electrical signals; magnetoelectric media for storing information; and high frequency devices for electric field control of magnetic devices or magnetic field control of electric devices.

5 Claims, 21 Drawing Sheets

OTHER PUBLICATIONS

D. Ravinder, "Elastic behaviour of zinc substituted lithium ferrites," Materials Letters 45 (2000) 68-70.*
A.V. Ramana Reddy et al., "Electrical transport properties of zinc-substituted cobalt ferrites," Materials Letters 39 (1999) 153-165.*
Astrov, Soviet Phys. JETP 13: 729 (1961).
Rado and Folen, Phys. Rev. Lett. 7: 310 (1961).
Foner and Hanabusa, J. Appl. Phys. 34: 1246 (1963).
Tsujino and Kohn, Solid State Commun. 83: 639 (1992).
Kornev et al., Phys. Rev. B 62: 12247 (2000).
Suchtelen, Philips Res. Rep. 27: 28 (1972).
Van den Boomgaard et al., J. Mater. Sci. 9: 1705 (1974).
Van den Boomgaard et al., Ferroelectrics 14: 727 (1976).
Harsche et al., Int. J. Appl. Electromagn. Mater. 4: 145 (1993).
Avellaneda and Harsche, J. Intell. Mater. Syst. Struct. 5: 501 (1994).
Harsche, Ph.D. thesis, Pennsylvania State University (1991).
Srinivasan et al., Phys. Rev. B 64: 214408 (2001).
Van den Boomgaard and Born, J. Mater. Sci. 13: 1538 (1978).
Lupeiko et al., Inorganic Materials 31: 1245 (1995).
Ryu et al., J. Elec. Ceramics 7: 17 (2001).
Ryu et al., Jpn. J. Appl. Phys. 40: 4948 (2001).
Srinivasan et al., Phys. Rev. B 65: 1344xx (2002).
Landolt-Borstein: Numerical data and functional relationships in science and technology, Group III, Crystal and Solid State Physics, vol. 4(b), Magnetic and Other Properties of Oxides, eds. Hellwege and Springer, Springer-Verlag, New York (1970).
Wood and Austin, in Proceedings of the Symposium on Magnetoelectric Interaction Phenomena in Crystals, Seattle, 1973, edited by Freeman & Schmid (Gordon and Breach, New York, 1975), p. 181).
Piezoelectric Ceramics Materials Properties (American Piezo Ceramics, Inc., Mackeyville, Pennsylvania, 1998).
Bichurin et al., Phys. Rev. B 64: 094409 (2001).

* cited by examiner

US 7,201,817 B2

MAGNETOELECTRIC MULTILAYER COMPOSITES FOR FIELD CONVERSION

CROSS-REFERENCE TO RELATED APPLICATION

This application is a Divisional of U.S. application Ser. No. 10/125,670, filed Apr. 18, 2002, now U.S. Pat. No. 6,835,463.

STATEMENT REGARDING FEDERALLY SPONSORED RESEARCH OR DEVELOPMENT

This invention was supported by National Science Foundation Grant No. DMR-0072144. The U.S. government has certain rights in this invention.

REFERENCE TO A "COMPUTER LISTING APPENDIX SUBMITTED ON A COMPACT DISC"

Not Applicable.

BACKGROUND OF THE INVENTION (1) Field of the Invention

The present invention relates to magnetoelectric multilayer composites comprising alternate layers of a magnetostrictive material, which is a bimetal ferrite wherein one of the metals is zinc, and a piezoelectric material such as lead zirconate titanate (PZT), lead zincate niobate (PZN), lead zincate niobate lead-titanate (PZN-PT), lead magnesium niobate lead-titanate (PMN-PT), lead lanthanum zirconate titanate (PLZT), Nb/Ta doped-PLZT, and barium zirconate titanate (BZT) for facilitating the conversion of an electric field into a magnetic field or vice versa. The preferred composites include cobalt, nickel, or lithium zinc ferrite and PZT films which are arranged in a bilayer or in alternating layers, laminated, and sintered at high temperature. The composites are useful in sensors for detection of magnetic fields; sensors for measuring rotation speed, linear speed, or acceleration; read-heads in storage devices by converting bits in magnetic storage devices to electrical signals; magnetoelectric media for storing information; and high frequency devices for electric field control of magnetic devices or magnetic field control of electric devices.

(2) Description of Related Art

Conversion of electric to magnetic fields and vice versa plays an important role in many devices. One way in principle to accomplish this is a composite of magnetostrictive and piezoelectric materials. In such composites, the field conversion is a two step process: magnetostriction induced mechanical deformation resulting in induced electric fields. Until now, interest in such transducers has been lacking because of conversion efficiencies that are an order of magnitude below theoretical predictions.

The magnetoelectric (ME) effect is defined as the dielectric polarization of a material in an applied magnetic field or an induced magnetization in an external electric field (Landau and Lifshitz, *Electrodynamics of Continuous Media* (Pergamon, Oxford, 1960), p. 119). In materials that are magnetoelectric (ME), the induced polarization P is related to the magnetic field H by the expression, $P=\alpha H$, where $\alpha$ is the second rank ME-susceptibility tensor. A parameter of importance is the ME voltage coefficient $\alpha_E = \delta E/\delta H$ with $\alpha = \epsilon_0 \epsilon_r \alpha_E$ where $\epsilon_r$ is the relative permittivity. The effect, first observed in antiferromagnetic $Cr_2O_3$, is generally weak in single phase compounds (Astrov, Soviet Phys. JETP 13: 729 (1961); Rado and Folen, Phys. Rev. Lett. 7: 310 (1961); Foner and Hanabusa, J. Appl. Phys. 34: 1246 (1963); Tsujino and Kohn, Solid State Commun. 83: 639 (1992); Bichurin, Ferroelectrics 204: 356 (1997); Kornev et al., Phys. Rev. B 62: 12247 (2000)). A strong ME effect, however, could be realized in a "product-property" composite consisting of magnetostrictive (MS) and piezoelectric (PE) phases in which the mechanical deformation due to magnetostriction results in a dielectric polarization due to piezoelectric effects (Suchtelen, Philips Res. Rep. 27: 28 (1972)). Van den Boomgaard synthesized bulk composites of cobalt ferrite or nickel ferrite with $BaTiO_3$ that yielded ME voltage coefficient $\alpha_E$ that was a factor 40–60 smaller than calculated values (Van den Boomgaard et al., J. Mater. Sci. 9: 1705 (1974); Van den Boomgaard et al., Ferroelectrics 14: 727 (1976)). Possible causes for such low $\alpha_E$ include microcracks due to thermal expansion mismatch between the two phases, leakage current through low resistivity ferrites, porosity, and any impurity or undesired phases.

A multilayer structure is expected to be far superior to bulk composites since the PE layer can easily be poled electrically to enhance the piezoelectricity and the ME effect. In addition, MS layers enclosed in metal electrodes lead to series electrical connectivity for PE layers and further enhancement of piezoelectricity (Harshe et al., Int. J. Appl. Electromagn. Mater. 4: 145 (1993); Avellaneda and Harshe, J. Intell. Mater. Syst. Struct. 5: 501 (1994)). Harshe and co-workers proposed a theoretical model for a magnetostrictive-piezoelectric bilayer structure. The estimated $\alpha_E$ for cobalt ferrite (CFO)-lead zirconate titanate (PZT), or -barium zirconate titanate (BZT), bilayer was in the range 0.2–5 V/cm Oe, depending on field orientations, boundary conditions, and material parameters (Harshe, Ph.D. thesis, Pennsylvania State University (1991)). They also prepared multilayers by sintering tape-cast ribbons (Harshe et al., Int. J. Appl. Electromagn. Mater. 4: 145 (1993); Avellaneda and Harshe, J. Intell. Mater. Syst. Struct. 5: 501 (1994)). Samples of CFO—$BaTiO_3$ structures did not show ME effects. The largest $\alpha_E$=75 mV/cm Oe, a factor of 3–30 times smaller than theoretical values, was measured for CFO-PZT. The low $\alpha_E$ or the absence of ME effect is most likely due to unfavorable interface conditions and the following problems due to the use of platinum electrodes at the interface: (i) the electrode makes it a three-phase multilayer structure and leads to poor mechanical coupling between the two oxide layers, (ii) platinum with thermal expansion coefficient much higher than that of oxides will result in micro-cracks at the interface during sample processing, (iii) measurement conditions for ME effects might correspond to the inelastic region of stress-strain characteristics for Pt leading to a reduction in ME coefficients.

In summary the use of appropriate MS and PE phases and the elimination of foreign electrodes are critically important for obtaining large ME effects in the multilayer (ML) structures. However, current materials available for making magnetostrictive and piezoelectric composites produce composites which have conversion efficiencies that are an order of magnitude below theoretical predictions. The present invention provides a novel class of materials for making magnetostrictive and piezoelectric composites that have a large ME effect and maximum field conversion efficiency.

SUMMARY OF THE INVENTION

The present invention provides magnetoelectric multilayer composites comprising alternate layers of a magnetostrictive material, which is a sintered bimetal ferrite wherein one of the metals is zinc, and a piezoelectric layer such as lead zirconate titanate (PZT), lead zincate niobate (PZN), lead zincate niobate lead-titanate (PZN-PT), lead magnesium niobate lead-titanate (PMN-PT), lead lanthanum zirconate titanate (PLZT), Nb/Ta doped-PLZT, and barium zirconate titanate (BZT) for facilitating the conversion of an electric field into a magnetic field or vice versa. The preferred composites include cobalt, nickel, or lithium zinc ferrite and PZT films which are arranged in a bilayer or in alternating layers, laminated, and sintered at high temperature to produce the composite. The composites are useful in smart sensors for detection of magnetic fields; sensors for measuring rotation speed, linear speed, or acceleration; read-heads in storage devices by converting bits in magnetic storage devices to electrical signals; magnetoelectric media for storing information; and high frequency devices for electric field control of magnetic devices or magnetic field control of electric devices.

Therefore, the present invention provides in a magnetoelectric composite comprising at least one piezoelectric composition and at least one magnetostrictive composition as separate layers joined together, the improvement which comprises a sintered bimetal ferrite as the magnetostrictive composition, wherein one of the metals is zinc, and wherein the composite has a magnetoelectric voltage coefficient of at least 100 mV/cm Oe.

In a particular embodiment of the magnetoelectric composite, the piezoelectric material is selected from the group consisting of lead zirconate titanate (PZT), lead zincate niobate (PZN), lead zincate niobate lead-titanate (PZN-PT), lead magnesium niobate lead-titanate (PMN-PT), lead lanthanum zirconate titanate (PLZT), Nb/Ta doped-PLZT, and barium zirconate titanate (BZT).

In a preferred embodiment of the magnetoelectric composite, the bimetal ferrite has the formula:

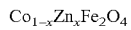

where x is 0.2 to 0.5. Alternatively, the bimetal ferrite is a nickel zinc ferrite which has the formula:

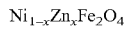

where x is 0.1 to 0.5 or a lithium zinc ferrite which has the formula:

where x is 0.1 to 0.4.

The present invention further provides in a method for forming a magnetoelectric composite wherein a combination of a piezoelectric composition and a magnetostrictive composition are joined together in separate layers, the improvement which comprises (a) providing a bimetal ferrite powder, wherein zinc is one of the metals, as the magnetostrictive composition; (b) forming a combination of the powder of step (a) with a powder of a piezoelectric material in the separate layers; and (c) compressing and sintering the combination of step (b) to form the magnetoelectric composite.

In a particular embodiment of the method, the piezoelectric material is selected from the group consisting of lead zirconate titanate (PZT), lead zincate niobate (PZN), lead zincate niobate lead-titanate (PZN-PT), lead magnesium niobate lead-titanate (PMN-PT), lead lanthanum zirconate titanate (PLZT), Nb/Ta doped-PLZT, and barium zirconate titanate (BZT).

In a preferred embodiment of the method, the bi-metal ferrite has the formula:

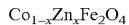

where x is 02. to 0.5. Alternatively, the bimetal ferrite is a nickel zinc ferrite which has the formula:

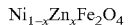

where x is 0.1 to 0.5 or a lithium zinc ferrite which has the formula:

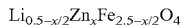

where x is 0.1 to 0.4.

OBJECTS

It is an object of the present invention to provide materials for making magnetostrictive and piezoelectric composites that have a large ME effect and maximum field conversion efficiency.

Is a further object of the present invention to provide magnetostrictive and piezoelectric composites that have a large ME effect and maximum field conversion efficiency and which are useful inter alia for magnetoelectric memory devices, electrically controlled magnetic devices, magnetically controlled piezoelectric devices, and smart sensors.

These and other objects of the present invention will become increasingly apparent with reference to the following drawings and preferred embodiments.

DETAILED DESCRIPTION OF THE INVENTION

Figure 1:
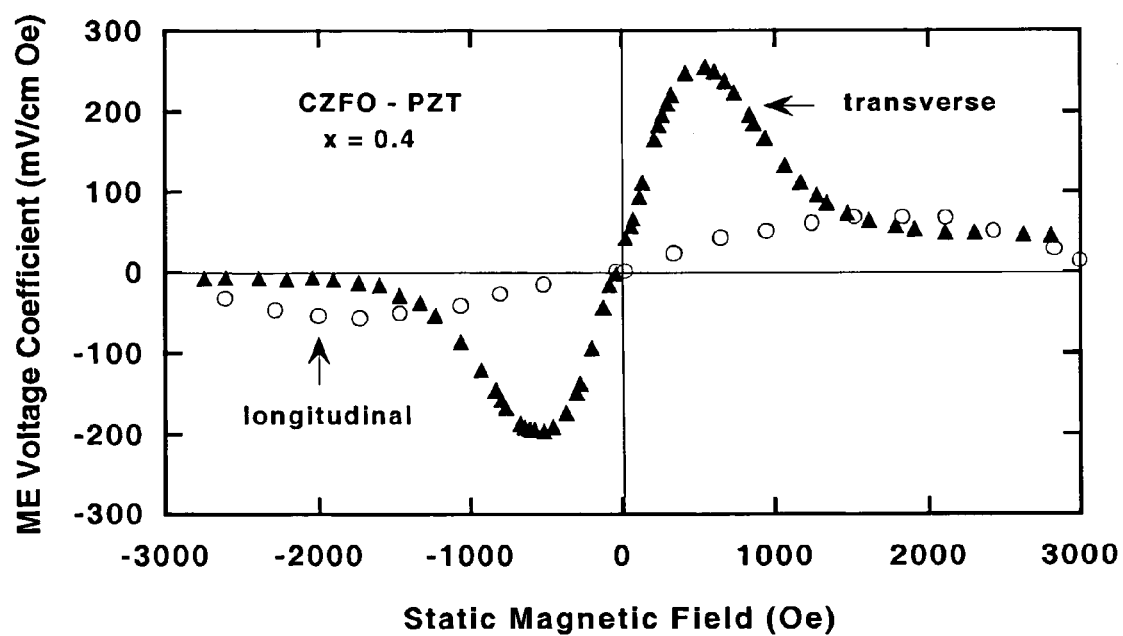
FIG. 1 shows the magnetoelectric (ME) voltage coefficient $\alpha_E = \delta E/\delta H$ versus bias magnetic field H for a multilayer sample of $Co_{1-x}Zn_xFe_2O_4$ (CZFO) (x=0.4)-lead zirconate titanate (PZT). The sample contained 11 layers of CZFO and 10 layers of PZT with a thickness of 18 μm. The data at room temperature and 100 Hz are for transverse (out-of-plane δE perpendicular to in-plane δH (diamonds)) and longitudinal (out-of-plane δE and δH (circles)) field orientations. There is a 180 degree phase difference between voltages for +H and −H.

All patents, patent applications, government publications, government regulations, and literature references cited in this specification are hereby incorporated herein by reference in their entirety. In case of conflict, the present description, including definitions, will control.

The term "magnetoelectric" refers to the effect in which an electric field is produced in a material when it is subjected to a static magnetic field or vice versa. It is either the dielectric polarization of a material in an applied magnetic field or an induced magnetization in an external electric field. Materials that respond to both electric and magnetic fields are considered to be magnetoelectric and to facilitate field conversion.

The term "magnetostrictive" refers to the dimensional change by which a ferromagnetic material is transformed from one shape to another in the presence of a magnetic field. This solid-state phenomenon is a result of the rotation of small magnetic domains, causing internal strains in the material. These strains result in a positive expansion of the material in the direction of the magnetic field. As the magnetic field is increased, more domains rotate and become aligned until magnetic saturation is achieved. If the magnetic field is reversed, the direction of the domains is also reversed but the strains still result in a position expansion in the field direction. Since the magnetostrictive forces are molecular in origin, the mechanical response is very fast—a matter of microseconds. On the macroscopic scale, a magnetostrictive material conserves volume (of an essentially incompressible material); the diameter decreases as the length grows. The effect generates elastic forces in accordance with a generalized Hooke's law.

The term "piezoelectric" refers to the effect in those materials which contain certain crystals that exhibit charges. The crystals only produce an electric output when they experience a change in load. The piezoelectric effect is exhibited by certain crystals, e.g., quartz and Rochelle salt, and certain ceramic materials such as those of the lead zirconate titanate family and the barium titanate family. When a voltage is applied across certain surfaces of a solid that exhibits the piezoelectric effect, the solid undergoes a mechanical distortion. Piezoelectric materials are used in transducers, e.g., phonograph cartridges, microphones, and strain gauges, which produce an electrical output from a mechanical input, and in earphones and ultrasonic radiators, which produce a mechanical output from an electrical input. Piezoelectric solids typically resonate within narrowly defined frequency ranges; when suitably mounted they can be used in electric circuits as components of highly selective filters or as frequency-control devices for very stable oscillators.

The term "Oe" refers to oersted which is measure of magnetic field strength. One oersted is equal to 79.578 ampere per meter (A/m). Conversely, 1 A/m is 0.012566 Oe. The ampere per meter is the International Unit of magnetic field strength. It is derived from basic standard units but is expressed directly in base units and cannot be further reduced. Magnetic field strength is directly proportional to the linear density so if the linear current density doubles, so does the magnetic field strength, if the linear density decreases by half, the magnetic field decreases by half.

Composites are desirable for the synthesis of materials with unique or improved properties (Van Suchtelen, Philips Res. Rep., 27: 28 (1972)). Samples containing piezomagnetic and piezoelectric phases, for example, are product property composites capable of conversion of energies stored in electric and magnetic fields (Van den Boomgaard, et al., J. Mater. Sci. 9: 1705 (1974); Van den Boomgaard, et al., Ferroelectrics 14: 727 (1976); Van den Boomgaard and Born, J. Mater. Sci. 13: 1538 (1978); Harshe et al., Int. J. Appl. Electromag. Mater. 4: 145 (1993); Avellaneda and Harshe, J. Intell. Mater. Syst. Struct. 5: 501 (1994); Lupeiko et al., Inorganic Materials 31: 1245 (1995); Ryu et al., J. Elec. Ceramics 7: 17 (2001); Ryu et al., Jpn. J. Appl. Phys. 40: 4948 (2001); Srinivasan et al., Phys. Rev. B 64: 214408 (2001); Srinivasan et al., Phys. Rev. B 65: 1344xx (2002)). The field conversion is possible since an applied magnetic field produces a strain in the piezomagnetic phase, which in turn is coupled to the piezoelectric phase, resulting in an induced electric field. The magnetoelectric (ME) coupling is studied by measuring the induced electric field $\delta E$ produced by an applied ac magnetic field $\delta H$. The ME voltage coefficient $\alpha_E$ is given by $\alpha_E = \delta E/\delta H$.

Studies on ME composites were initiated in the early 1970s and were primarily on bulk samples of ferrimagnetic spinel ferrites and piezoelectric barium titanate (Van den Boomgaard, et al., J. Mater. Sci. 9: 1705 (1974); Van den Boomgaard, et al., Ferroelectrics 14: 727 (1976); Van den Boomgaard and Born, J. Mater. Sci. 13: 1538 (1978)). Although ferrites are not piezomagnetic, magnetostriction in an ac magnetic field gives rise to pseudo piezomagnetic effects. The bulk composites yielded $\alpha_E$ values that were two to three orders of magnitude smaller than theoretical predictions. Such low values are primarily due to low resistivity for ferrites that (i) limits the electric field used for poling the composite and consequently a poor piezoelectric coupling and (ii) a leakage current that results in the loss of induced voltage. These difficulties could easily be eliminated in a layered composite (Harshe et al., Int. J. Appl. Electromag. Mater. 4: 145 (1993); Avellaneda and Harshe, J. Intell. Mater. Syst. Struct. 5: 501 (1994)). Theoretical estimates of $\alpha_E$ for a bilayer of ferrite-lead zirconate titanate (PZT) are comparable to bulk composite values. The ease of poling in a bilayer allows enhancement of piezoelectric, and therefore, ME effects. The largest $\alpha_E$ ever achieved was reported recently in trilayers of terfenol and PZT (Ryu et al., Jpn. J. Appl. Phys. 40: 4948 (2001)).

Ferrite ($Fe_2O_4$) based layered composites studied in the prior art include cobalt ferrite (CFO)- or nickel ferrite (NFO)-PZT (Harshe et al., Int. J. Appl. Electromag. Mater. 4: 145 (1993); Avellaneda and Harshe, J. Intell. Mater. Syst. Struct. 5: 501 (1994); Lupeiko et al., Inorganic Materials 31: 1245 (1995); Srinivasan et al., Phys. Rev. B 64: 214408 (2001) and Example 6). In particular, composites with CFO are of interest because of high magnetostriction. Samples were prepared either by laminating and sintering thick films of ferrites and PZT or by gluing ferrite and PZT discs with silver epoxy (Harshe et al., Int. J. Appl. Electromag. Mater. 4: 145 (1993); Avellaneda and Harshe, J. Intell. Mater. Syst. Struct. 5: 501 (1994)). Studies on CFO-PZT structures revealed a maximum $\alpha_E$ on the order of 75 mV/cm Oe, an order of magnitude larger than in bulk composites. But the measured values, however, are an order of magnitude smaller than theoretical values for a bilayer. Thus composites with magnetically hard cobalt ferrite showed weak ME coupling in spite of high magnetostriction (Harshe et al., Int. J. Appl. Electromag. Mater. 4: 145 (1993); Avellaneda and Harshe, J. Intell. Mater. Syst. Struct. 5: 501 (1994)). Nickel ferrite, on the other hand, is a soft ferrite with a much smaller anisotropy and magnetostriction than CFO. In Example 6 using layered samples of NFO-PZT, the results showed a large ME coupling on the order of 1500 mV/cm Oe and $\alpha_E$ values in excellent agreement with theory. These observations are indicative of the influence of magnetic parameters such as anisotropy and initial permeability of ferrites on ME effects. In particular, the Joule magnetostriction that gives rise to pseudo piezomagnetic is dependent on the domain dynamics, which is a function of anisotropy and coercivity.

Example 1 provides an understanding of the effects of the magnetic parameters of ferrites on ME coupling in multilayers with PZT. It is possible to accomplish controlled variations in such parameter with Zinc substitution in ferrites. The results in Example 1 relate to the strength of ME coupling in the bimetal ferrites wherein one of the metals of the bimetal is zinc-PZT composites of the present invention. The following oxides were used for the magnetic phase of the composites of the present invention: cobalt zinc ferrite, $Co_{1-x}Zn_xFe_2O_4$ (CZFO) (x=0–0.6), nickel zinc ferrite $Ni_{1-x}Zn_xFe_2O_4$ (NZFO) (x=0–0.5), and lithium zinc ferrite $Li_{0.5-x/2}Zn_xFe_{2.5-x/2}O_4$ (LZFO) (x=0–0.4). Commercially available PZT was used for the piezoelectric phase. Layered samples were prepared by lamination and sintering of ferrite and PZT thick films obtained by tape casting. The ME voltage coefficients were measured for transverse ($\delta E$ perpendicular to $\delta H$) and longitudinal ($\delta E$ parallel to $\delta H$) field orientations for frequencies 10–1000 Hz.

Example 1 provides clear evidence for strengthening of ME effects with the substitution of Zinc for a part of the metal component in the metal ferrite to produce the bimetal ferrite wherein one of the metals is zinc-PZT composites of the present invention, with the largest increase in CZFO-PZT and the smallest increase for NZFO-PZT. In all of the composites, a transverse ME coupling that is at least an order of magnitude stronger than the longitudinal coupling due to relative strengths of the piezomagnetic effects was observed. In CZFO-PZT, $\alpha_E$ increased as the Zinc concentration was increased and showed a maximum for x=0.4. The coupling weakened with further increase in zinc concentration. There was an excellent correlation between variations of initial permeability and ME coupling with x. Comparison of data and theoretical estimates of $\alpha_E$ indicated very good agreement only for Zinc substituted composites, x=0.4. A similar behavior for ME coupling was observed for LZFO-PZT multilayer samples, but the maximum in $\alpha_E$ occurred for samples with x=0.3. But for NZFO-PZT, the theory accounted very well for the magnitude and H variation of $\alpha_E$ for the entire series of samples, irrespective of x value.

The data indicated that enhancement in ME coupling with zinc substitution was related to (i) a reduction in magnetic anisotropy, leading to high permeability and, therefore, strong pseudo piezomagnetic effects in the ferrite and (ii) a reduction in processing temperature resulting in fewer interface defects and efficient coupling between the ferrite and PZT layers. The multilayer ferrite-PZT structures herein showed a strong ME coupling and are of interest for use as sensors and in high frequency devices.

Therefore, the present invention provides multilayer composites which facilitate the conversion of an electric field into a magnetic field or a magnetic field into an electric field. The composites comprise one or more alternating phases of two types: a first phase which is a magnetostrictive phase which comprises a ferromagnetic material that deforms in an applied magnetic field and a second phase which is a piezoelectric phase which comprises a piezoelectric material that converts the deformation to an electric field.

The first phase comprises a sintered bimetal ferrite wherein one of the metals comprising the bimetal component is zinc (substituted with zinc), which deforms in a magnetic field. The second phase comprises a piezoelectric material such as lead zirconate titanate (PZT), lead zincate niobate (PZN), lead zincate niobate lead-titanate (PZN-PT), lead magnesium niobate lead-titanate (PMN-PT), lead lanthanum zirconate titanate (PLZT), Nb/Ta doped-PLZT, and barium zirconate titanate (BZT) which generates electricity when deformed. Preferably, the bimetal ferrite wherein one of the metals comprising the bimetal component is zinc is selected from the group consisting of nickel zinc ferrite (NZFO), cobalt zinc ferrite (CZFO), lithium zinc ferrite (LZFO), and combinations thereof.

In a preferred embodiment, the sintered bimetal ferrite wherein one of the metals comprising the bimetal component is zinc (Zn) has the formula $Metal_{1-x}Zn_xFe_2O_4$ wherein x is between about 0.1 to 0.6. Preferably, the metal is cobalt (Co), nickel (Ni), or lithium (Li). When the bimetal ferrite comprises Co (CZFO), it has the formula $Co_{1-x}Zn_xFe_2O_4$ wherein X is between about 0.1 to 0.6, most preferably, between about 0.2 to 0.5. When the bimetal ferrite comprises Ni (NZFO), it has the formula $Ni_{1-x}Zn_xFe_2O_4$ wherein x is preferably between about 0.1–0.5. When the bimetal ferrite comprises Li (LZFO), it has the formula $Li_{0.5-x/2}Zn_xFe_{2.5-x/2}O_4$ wherein x is preferably between about 1.0 and 0.4.

The multilayer composites are made by separately producing films of each of the two phases and arranging the films into a bilayer or into a multilayer comprising alternating layers of the two phases which are then laminated and sintered at high temperature to produce the bilayer or multilayer composites of the present invention.

The bilayer and multilayer composites of the present invention show a large magnetoelectric (ME) effect and maximum field conversion efficiency. The novel element of the composites is that zinc comprises one of the metals in the bimetal ferrite. For example, the NZFO-PZT composites have a conversion coefficient ($\alpha_E$) which ranges from about 300 to 1500 mV/cm Oe depending on the concentration of zinc in the NZFO and the number of layers comprising the composite. The ME coefficient is maximum at room temperature and a general increase in $\alpha_E$ is observed with increasing frequency. The observed $\alpha_E$ values for the bilayer and multilayer composites of the present invention are the largest ever measured for a ferrite-PZT system. The reason for the large ME effect and maximum field conversion efficiency is that the bimetal ferrite comprises zinc as one of the metals in the bimetal component which imparts a high piezomagnetic effect and an efficient stress-mediated magnetic moment-electric dipole coupling at the NZFO-PZT interface. CZFO-PZT, NZFO-PZT, and LZFO-PZT composites all have impressive conversion coefficients ($\alpha_E$) over metal ferrite composites. The $\alpha_E$ of the CZFO-PZT, NZFO-PZT, and LZFO-PZT composites depends on the concentration of zinc in the bimetal ferrite and the number of layers comprising the composite. It was particularly surprising that CZFO-PZT composites have a magnetoelectric effect that is about 600 times greater than that of CFO-PZT composites.

Bimetal ferrites wherein one of the metals is zinc-piezoelectric material bilayers and multilayers include NZFO-PZT, CZFO-PZT, LZFO-PZT, or combinations thereof are preferably synthesized from films prepared by tape casting. The process involves (i) preparation of a submicron-sized powder of the bimetal ferrite wherein one of the metals is zinc and the piezoelectric material, (ii) preparing thick-film tapes of each from the powders by doctor-blade techniques, and (iii) lamination and sintering of bilayers and multilayers.

Bimetal ferrite powder wherein one of the metals is zinc is obtained by standard ceramic techniques, which involves mixing the oxides or carbonates of the metals followed by pre-sintering and final sintering. One method for preparing CZFO is as follows. A mixture is prepared comprising cobalt oxide (CoO), zinc oxide (ZnO), and ferric oxide ($Fe_2O_3$) in appropriate amounts to produce $Co_{1-x}Zn_xFe_2O_4$ wherein X is between about 0.1 to 0.6, most preferably, between about 0.2 to 0.5. The mixture is then ball milled, dried, followed by calcinating at about 800° C. to 850° C. for about one to three hours. NZFO and LZFO can be prepared in a similar manner to produce $Ni_{1-x}Zn_xFe_2O_4$ wherein x is preferably between about 0.1–0.5 and $Li_{0.5-x/2}Zn_xFe_{2.5-x/2}O_4$ wherein x is preferably between about 0.1 and 0.4. The piezoelectric material includes any one of PZT, PZN, PZN-PT, PMN-PT, PLZT, Nb/Ta doped-PLZT, and BZT.

For tape casting (Mistler et al., In *Tape Casting: Theory and Practice* (American Ceramics Society, Westerville, Ohio, 2000), powders of the bimetal ferrite wherein one of the metals is zinc and the piezoelectric material are each separately mixed with a solvent such as ethyl alcohol and a dispersant such as Blown Menhaden fish oil (available from Richard E. Mistler, Inc., Morrisville, Pa.) and ball milled for 24 hours, followed by a second ball mill with a plasticizer such as butyl benzyl phthalate and a solution containing a binder such as polyvinyl butyral in an ether-alcohol mixture for 24 hours to produce a slurry of the bimetal ferrite wherein one of the metals is zinc and a slurry of the piezoelectric material. The plasticizer enhances the elasticity of the films prepared by tape casting of the slurries and the wettability of the ball-milled powders by the solution.

The slurries are each separately cast into tapes of either the bimetal ferrite wherein one of the metals is zinc or the piezoelectric material on a carrier film such as silicon-coated mylar sheets using doctor-blade techniques. That is, the slurries are cast into tapes on a carrier film using a tape caster consisting of a pair of stationary micrometer-controlled blades and a moveable casting bed such as that available from Richard E. Mistler, Inc. In general, it is possible to obtain 10×20 cm² tapes with a thickness within the range of about 10 to 200 μm, preferably 15 to 30 μm thick films. The bimetal ferrite wherein one of the metals is zinc and PZT tapes are then arranged to obtain the desired structure, a bilayer consisting of a bimetal ferrite wherein one of the metals is zinc and a PZT tape or multilayers consisting of alternating layers of NZFO and PZT tapes.

The bilayer or multilayer structures are laminated under high pressure between about 210 Kgf/cm² and 352 Kgf/cm² (3000 and 5000 psi) and under high temperature of about 400° K (about 100° C.). The plasticizer enables dense bilayer or multilayer structures to be made. The green laminated bilayer or multilayer structures are then heated at about 1000° K (about 1050 to 1200° C.) for several hours to evaporate the binder. The final sintering of the laminated bilayer or multilayer is then carried out at between about 1400 and 1500° K.

Bilayers can be made with 200-μm-thick films of the bimetal ferrite wherein one of the metals is zinc and the piezoelectric material. Multilayers consist of alternate layers of the bimetal ferrite wherein one of the metals is zinc and the piezoelectric material totaling n+1 layers of the bimetal ferrite wherein one of the metals is zinc and n layers of PZT (n=5 to 29, preferably 10 to 15), with a layer thickness of 10 to 20 μm.

The bilayers or multilayers can be cut perpendicular to the laminates to produce appropriately sized disks or billets and then ground. Contacts to the can be made by firing silver paste or depositing nickel from solution and then poling to the bilayers or multilayers in a silicon oil at 90 to 100° C. for 20 to 30 minutes in an electric field of 2.6 to 3 kV/mm.

Solvents suitable for preparing the tapes of the bimetal ferrite wherein one of the metals is zinc and the piezoelectric material include lower alkyl alcohols such as ethyl alcohol.

Binders suitable for preparing the tapes of the bimetal ferrite wherein one of the metals is zinc and the piezoelectric material include but are not limited to polyvinyl butyral, Acyloid B-72, and polypropylene carbonate.

Dispersants/deflocculants suitable for preparing the tapes of the bimetal ferrite wherein one of the metals is zinc and the piezoelectric material include but are not limited to Blown Menhaden fish oil and Hypermer KD-1.

Plasticizers suitable for preparing the tapes of the bimetal ferrite wherein one of the metals is zinc and the piezoelectric material include but are not limited to n-butyl phthalate, dioctyl phthalate, butyl benzyl phthalate, propylene carbonate, and polyalkylene glycol.

Carrier films suitable for preparing the tapes of the bimetal ferrite wherein one of the metals is zinc and the piezoelectric material include but are limited to silicon coated MYLAR, MYLAR-A propylene, and non-silicon release carriers.

Structural studies on the composites can be done with x-ray diffraction on multilayers, crushed powder samples, and samples with exposed interface by etching away the top layer. Magnetostriction can be measured using the standard gage technique.

The magnetoelectric bilayer and multilayer composites are useful in a plurality of applications such as smart sensors for detecting magnetic fields by measuring the electrical voltage produced; sensors for measurements of rotation speed, linear speed, or acceleration, which is particularly in the automotive industry; read-heads in storage devices which convert bits in magnetic devices to electric signals and vice versa; storage media such as magnetoelectric media to store information; and, high frequency devices such as electric field control of magnetic devices and magnetic field control of electric devices. The magnetoelectric composites are further useful in passive solid state magnetic sensors (PSSM) which include speed sensors, flow sensors, and electrical current sensors; electric generators; and magnetic-field sensors.

PSSM sensors are disclosed in U.S. Pat. No. 6,279,406 to Li et al. and published U.S. Application 2001/0040450 to Li et al. A PSSM sensor anticipated by the present invention typically includes a magnetoelectric bilayer or multilayer composite comprising a piezoelectric material such as PZT, PZN, PZN-PT, PMN-PT, PLZT, Nb/Ta doped-PLZT, or BZT and a magnetostrictive material which is CZFO, NZFO, or LZFO. In response to a magnetic field, the magnetostrictive material causes a strain on the piezoelectric material that in turn produces an electrical output signal. The PSSM sensors consume no electric power and produce an electric signal with a magnetic field sensitivity of greater than 10 mV/Oe. PSSM sensors comprising the magneto-electric multilayer and bilayer composites of the present invention can be mass produced at low cost. Compared to variable reluctance coil sensor-based speed sensors, PSSM sensors comprising the magnetoelectric multilayer and bilayer composites of the present invention would be able to detect near zero speeds and compared to Hall and magne-toresistance sensors, has better field sensitivity, better temperature stability, and are less expensive to produce. When used as flow sensors, PSSM sensors comprising the magnetoelectric multilayer and bilayer composites of the present invention are particularly useful because they would in general require no power source and offer better sensitivity and smaller size than other magnetic sensors. When used as electrical current sensors, PSSM sensors comprising the magnetoelectric multilayer and bilayer composites of the present invention are particularly useful because they would have little or no zero offset voltage and would require little or no temperature compensation for general use.

Figure 24:
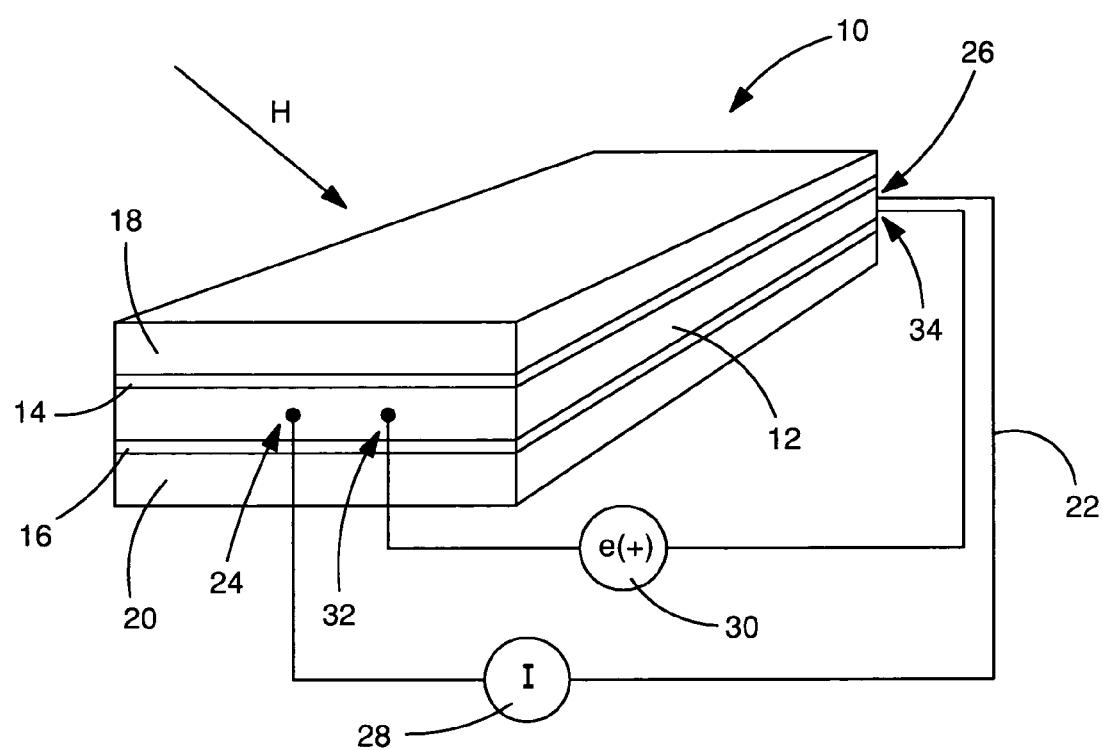
FIG. 24 shows a schematic view of an embodiment of magnetic field sensor 10 comprising magnetostrictive layers 18 and 20 and piezoelectric layer 12.

FIG. 24 illustrates an embodiment of a magnetic field sensor for estimating a value of a static or dynamic magnetic field as disclosed in published U.S. Application 2001/0028245 to Li et al. Such magnetic field sensors can include the magnetoelectric composites of the present invention. By way of example, FIG. 24 shows a magnetic field sensor 10 comprising a piezoelectric layer 12 comprising a piezoelectric material such as PZT, PZN, PZN-PT, PMN-PT, PLZT, Nb/Ta doped-PLZT, or BZT positioned between and mechanically connected across interfaces 14 and 16 to magnetostrictive layers 18 and 20 comprising either CZFO, NZFO, or LZFO. The interfaces 14 and 18 can be a thin electrically insulating layer or no insulating layer at all. A charge carrying line 22 is connected to the piezoelectric layer 12 at first and second spaced apart locations, 24 and 26, and a constant current source 28 is positioned on line 22. A voltmeter or other electrical measurement meter 30 is also positioned to measure a voltage difference or similar electrical measurement value created between third and fourth spaced apart positions, 32 and 34, on piezoelectric material 12 in response to the passage of current. Further configurations are shown in published U.S. Application 2001/0028245 to Li et al. For example, the sensor is a bilayer comprising a piezoelectric layer and a magnetostrictive layer mechanically connected at interface or the sensor comprises a magnetostrictive layer positioned between two piezoelectric layers and mechanically connected across the interfaces therebetween.

When the magnetostrictive layers, 18 and 20, are exposed to a magnetic field H, the layers will attempt to expand or contract in a selected direction that depends upon a present value H and a reference value H(ref) of the magnetic field. This difference in length in a selected dimension of the magnetostrictive layers, 18 and 20, produces a strain across interfaces 14 and 16. The attempt to change the length of the magnetostrictive layers, 18 and 20, may be partly or wholly resisted by the piezoelectric layer 12, interfaces, 14 and 16, or both, with the result that the piezoelectric layer 12 and the interfaces, 14 and 16, experience a strain, stress, or both. The induced strain in the piezoelectric layer 12 causes a change in the resistivity of the piezoelectric layer 12 which will in turn cause a change in the resistance associated with the path taken by the current through the piezoelectric layer 12 between the third and fourth locations, 32 and 34. This change in resistance will register as a change in current passing along line 22, or as a change in a voltage difference between the first and second locations, 24 and 26, and the change in current or voltage difference will register as a change in a reading of an ammeter or voltmeter 30. A change in current or voltage is measured for constant voltage or current, respectively.

The bilayer and multilayer composites of the present invention are also useful in the following specific applications: filtering elements used in conjunction with electrical connectors to suppress electromagnetic interference as disclosed in U.S. Pat. No. 5,512,196 to Mantese et al., piezo-magnetometers such as those disclosed in U.S. Pat. No. 5,675,252 to Podney for detecting and measuring magnetic and electric fields, magnetometers disclosed in U.S. Pat. Nos. 4,769,599 and 5,130,654 to Mermelstein, and memory storage material such as that used in computers and disclosed in U.S. Pat. No. 5,390,142 to Gendlin.

The following examples are intended to promote a further understanding of the present invention.

EXAMPLE 1

This example provides an understanding of the effects of the magnetic parameters of ferrites on ME coupling in multilayers with PZT. It is possible to accomplish controlled variations in such parameter with Zinc substitution in ferrites. The following oxides were used for the magnetic phase: cobalt zinc ferrite, $Co_{1-x}Zn_xFe_2O_4$ (CZFO) (x=0–0.6), nickel zinc ferrite $Ni_{1-x}Zn_xFe_2O_4$ (NZFO) (x=0–0.5), and lithium zinc ferrite $Li_{0.5-x/2}Zn_xFe_{2.5-x/2}O_4$ (LZFO) (x=0–0.4). Commercially available PZT was used for the piezoelectric phase.

I. MATERIALS AND METHODS

Layered composites were synthesized using thick films of ferrites and PZT obtained by tape casting (Mistler and Twiname, *Tape Casting: Theory and Practice*, The American Ceramics Society, Westerville, Ohio (2000)). The ferrite powder necessary for tape casting was prepared by the standard ceramic techniques that involved mixing the oxides or carbonates of the constituent metals, followed by pre-sintering, and final sintering. A ballmill was used to grind the powder to submicron size. Commercially available PZT powder was used for the PZT films (PZT: sample No. APC850, American Piezo Ceramics, Inc., Mackeyville, Pa.). A cast of ferrite or PZT was made by ballmilling the powder in ethyl alcohol with a dispersant, plasticizer, and a binder. The slurry thus obtained was cast into 15–30 micron thick tapes on mylar substrates using a custom-made tape caster consisting of a pair of stationary blades and a moveable platform. The tapes were dried for a day, removed from the substrate, and stacked to form the desired multilayer structure consisting of alternate layers of ferrites and PZT. Samples with (n+1) layers of ferrites and n layers of PZT (n=10–15) were laminated at high temperatures and high pressure and then sintered at 1375–1450 K for several hours. The two outer layers were ferrites in order to avoid any unwanted reaction between PZT and aluminum oxide powder used in the sintering process.

X-ray diffraction studies on the samples did not show any evidence for any phases other than spinel ferrite and PZT. Saturation magnetization measured with a Faraday balance was in agreement with expected values for ferrites. Magnetostriction was measured with the standard strain gage technique. The samples (5 mm×5 mm×0.5 mm) were then polished and poled in an electric field. The poling procedure involved heating the sample to 500 K and cooling it back to room temperature in an electric field of 15–30 kV/cm applied perpendicular to the sample plane. Electrodes were deposited on the sample with silver paint. The piezoelectric coupling coefficient was measured with a $d_{33}$-meter. For magnetoelectric characterization, the samples were placed in a shielded 3-terminal sample holder and placed between the pole pieces of an electromagnet that was used to apply a static magnetic field H. The required ac magnetic field (10 Hz–1 kHz) $\delta H$ parallel to H was generated with a pair of Helmholtz coils. The resulting ac electric field $\delta E$ perpendicular to the sample plane (direction-3) was estimated from measured voltage (with a lock-in-amplifier). The transverse coefficient $\alpha_{E,31}$ was measured for the magnetic fields (along direction-1) parallel to the sample plane and perpendicular to $\delta E$. The longitudinal coefficient $\alpha_{E,33}$ was measured for all the fields perpendicular to the sample plane. Magnetoelectric characterization was carried out as a function of frequency of the ac magnetic field, bias magnetic field H and sample temperature.

II. RESULTS

Studies were performed on multilayers with equal thickness for ferrite and PZT layers (15–30 micron) and a series of n-values (the number of PZT layers). The results reported here are for samples with n=10–15.

First to be considered were samples of CZFO-PZT. FIG. 1 shows representative data on the H dependence of $\alpha_{E,31}$ and $\alpha_{E,33}$ for a sample in which 40% Co was replaced by Zinc. The data at room temperature and 1 Oe ac field at 100 Hz was for a sample with n=10. As the bias field was increased from zero, a rapid increase to a peak value was observed for $\alpha_E$. With a further increase in H, the ME coupling coefficients dropped to a minimum or zero value. When H was reversed, a 180 degree phase difference relative to the ME voltage for +H and a small decrease in the peak value for $\alpha_E$ compared to the value for +H were observed. There was no noticeable hysteresis or remenance in the $\alpha_E$ vs H behavior. As discussed later, the H dependence in FIG. 1 essentially tracked the strength of piezomagnetic coupling which was proportional to the rate of change in magnetostriction with H in the ferrite. The coupling vanished when magnetostriction attained saturation.

Now the H dependence of transverse and longitudinal coefficients was compared. Although overall features for variations with H were similar for both cases, the following differences were found: (i) the initial rate of increase in $\alpha_E$ with H was much higher for the transverse case than for longitudinal orientation for the fields, (ii) the peak $\alpha_{E,31}$ was a factor of five higher than $\alpha_{E,33}$, and (ii) the peak value in $\alpha_{E,33}$ occurred for a higher bias field H than for the transverse case. These observations can be understood in terms of H variation of parallel and perpendicular magnetostriction for the ferrite.

Figure 2:
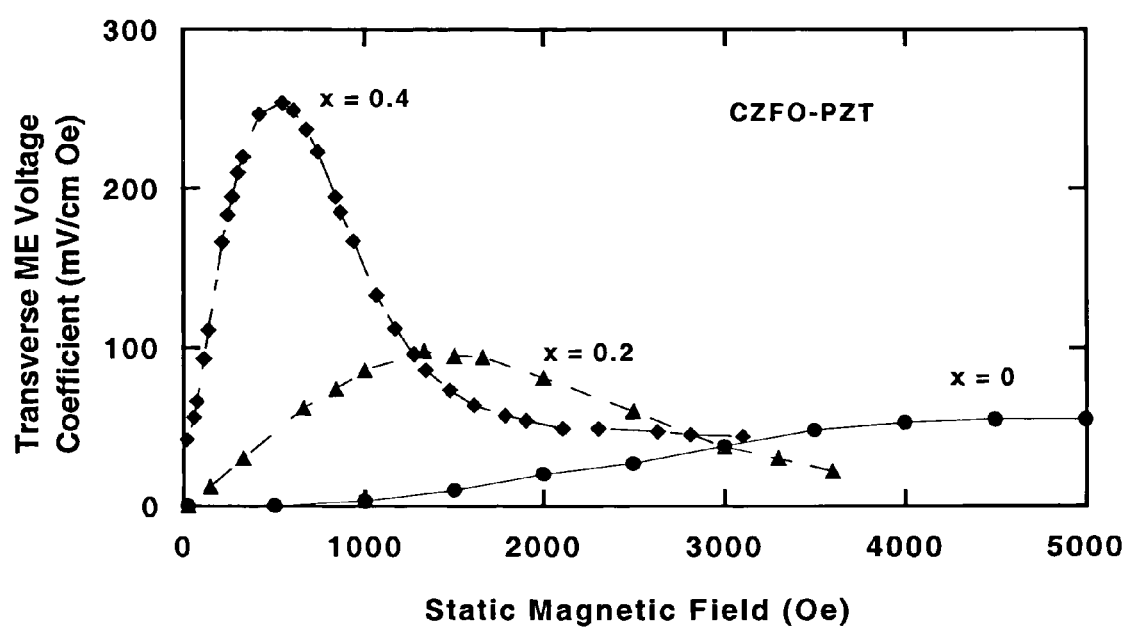
FIG. 2 shows the transverse ME voltage coefficient $\alpha_{E,31}$ as a function of H at room temperature and 100 Hz for multilayers of CZFO-PZT with x=0.0 (circles), x=0.2 (triangles), and x=0.4 (diamonds).

Similar $\alpha_E$ vs H data were obtained for samples with x-values varying from 0 to 0.6. Both $\alpha_{E,31}$ and $\alpha_{E,33}$ were measured. FIG. 2 shows the room temperature variation of $\alpha_{E,31}$ with the bias magnetic field for x=0–0.4. Data on the longitudinal coupling are not shown since the coupling was quite weak for all x-values except for 0.4. As x was increased, the rate at which $\alpha_{E,31}$ varies with H at low static magnetic fields increased, (ii) the peak in $\alpha_{E,31}$ occurred at progressively decreasing H, and (iii) there was a general increase in the peak value of $\alpha_{E,31}$.

Figure 3:
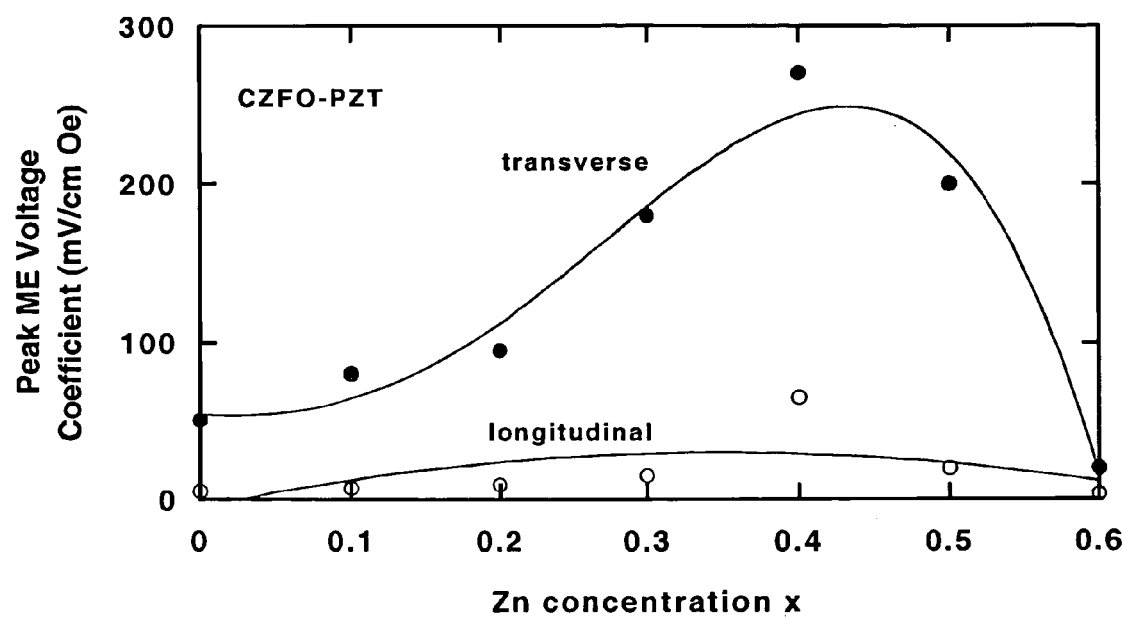
FIG. 3 shows the variation of peak transverse (filled circles) and longitudinal (open circles) ME voltage coefficients with zinc concentration x in layered CZFO-PZT. The data at room temperature and 100 Hz were obtained from profiles as in FIGS. 1 and 2.

In FIG. 3, the variation of peak values of $\alpha_E$ with x is shown for both transverse and longitudinal coefficients. As the Zinc substitution was increased, a sharp increase in $\alpha_{E,31}$, from 50 mV/cm Oe for x=0 to 280 mV/cm Oe for x=0.4 was observed. A further increase in x was accompanied by a substantial reduction in $\alpha_{E,31}$. A similar character was evident for the longitudinal coupling parameter.

Past attempts using cobalt ferrite-based ME composites included bulk samples with barium titanate or PZT and multilayers with PZT (Harshe, *Magnetoelectric effect in piezoelectric-magnetostrictive composites*, PhD thesis, The Pennsylvania State University, College Park, Pa., (1991)). Bulk samples of CFO-barium titanate showed evidence for ME coupling, but reported $\alpha_E$ values were a factor of 3–5 smaller than values in FIG. 3. Bulk composites of CFO-PZT showed very weak ME effects, but layered samples showed a maximum $\alpha_E$ of 75 mV/cm Oe (Harshe, *Magnetoelectric effect in piezoelectric-magnetostrictive composites*, PhD thesis, The Pennsylvania State University, College Park, Pa., (1991)). It is clear from the data in FIGS. 1–3 that Zinc substitution in cobalt ferrites was a key ingredient for strong ME coupling in multilayers. The efficient field conversion properties can be attributed to modification of magnetostriction due to Zinc substitution. There is also strong evidence that Zinc facilitates strong coupling at ferrite-PZT interface.

Figure 4A:
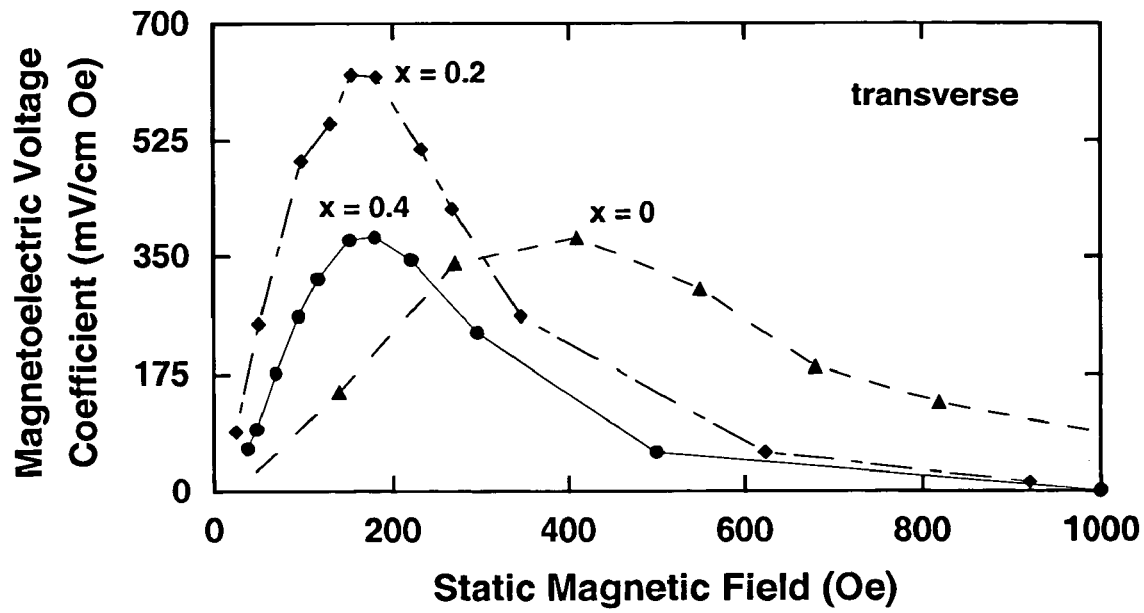
FIG. 4A shows the transverse ME voltage coefficients versus H data as in FIG. 1, but for multilayer samples of $Ni_{1-x}Zn_xFe_2O_4$ (NZFO)-PZT with x=0.0 (triangles), x=0.2 (diamonds), and x=0.4 (circles).
Figure 4B:
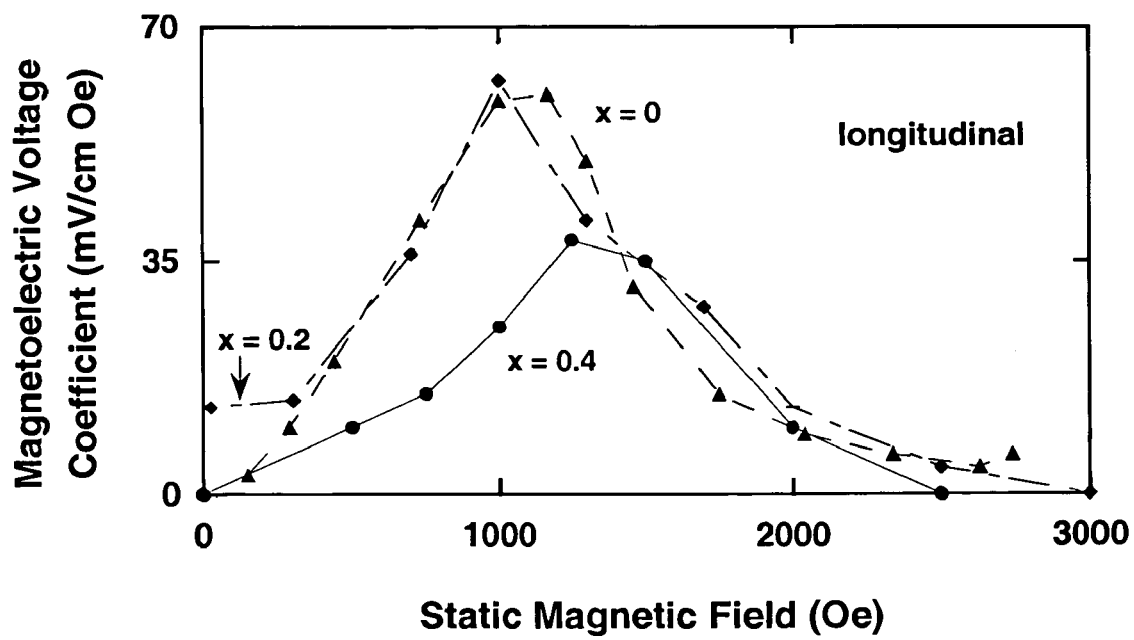
FIG. 4B shows the longitudinal ME voltage coefficients versus H data as in FIG. 1, but for multilayer samples of $Ni_{1-x}Zn_xFe_2O_4$ (NZFO)-PZT with x=0.0 (triangles), x=0.2 (diamonds), and x=0.4 (circles).

Similar ME studies were performed on nickel zinc ferrite-PZT samples with x=0–0.5 and lithium zinc ferrite samples with x=0–0.4. FIGS. 4A and 4B show representative data on the H dependence of $\alpha_E$ for NZFO-PZT samples with x=0–0.4. The data were obtained on samples with n=10–15 at room temperature for a frequency of 100 Hz. Data in FIGS. 4A and B are qualitatively similar to the observations for the composites of CZFO-PZT. For NFO-PZT (x=0), $\alpha_{E,31}$ vs H data showed the expected resonance-like character with a maximum centered at H=400 Oe. When Zinc was substituted for Ni, there was an increase in the peak value of $\alpha_{E,31}$ for low x-values. A down-shift was observed in the bias magnetic field corresponding to the peak value in of $\alpha_{E,31}$ as x was increased. The H field-range for strong ME effects decreases with increasing Zinc content. Data on the longitudinal coupling parameter in FIGS. 4A and 4B show the following important departures from the transverse case: (i) the coupling strength did not show any dependence on x for low Zinc substitution, (ii) as x was increased, an up-shift was observed for the H-value corresponding to peak $\alpha_{E,33}$, and (iii) the ME coupling was realized over a wide field range. Similar $\alpha_E$ vs H profiles were obtained for other x values.

Figure 5:
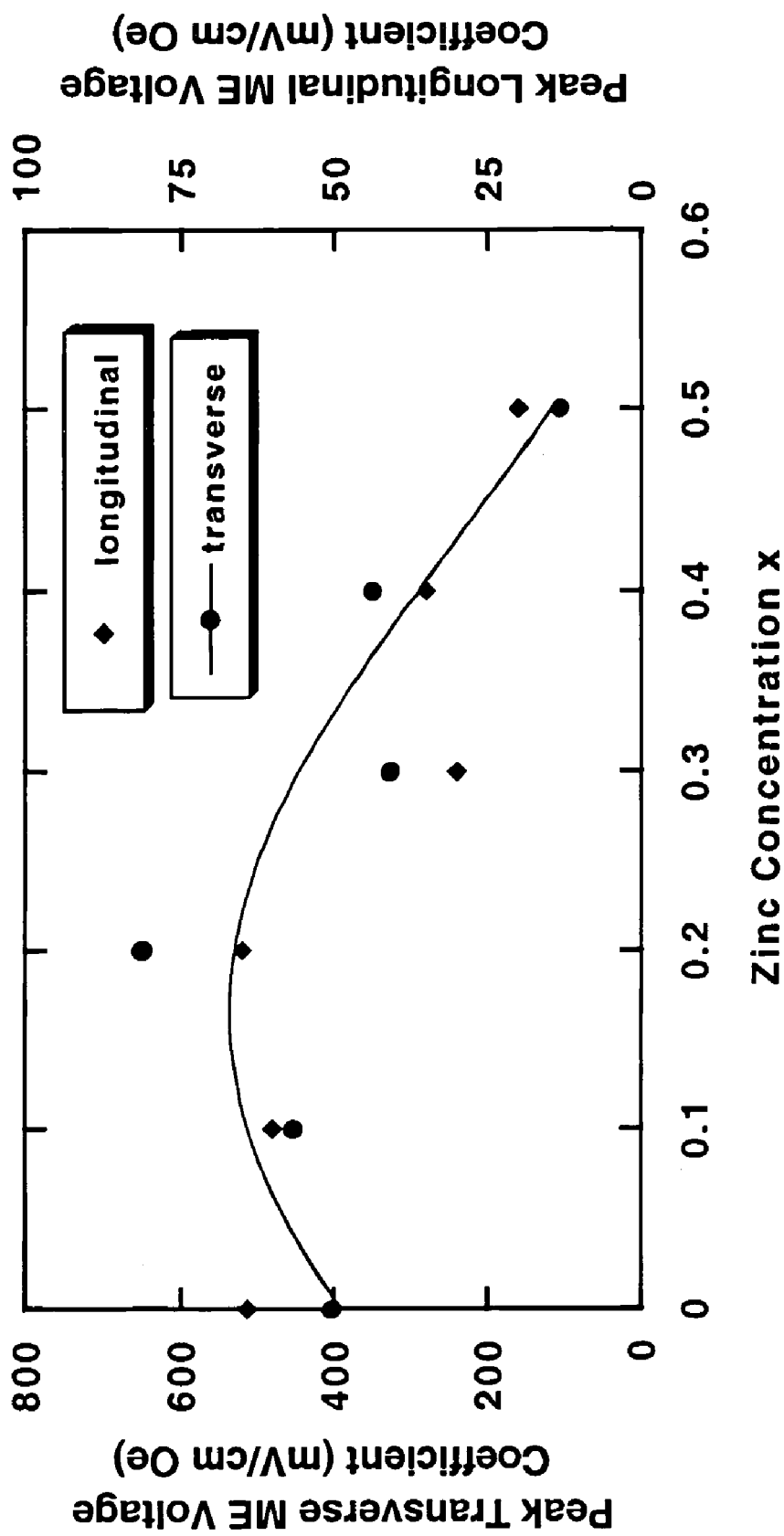
FIG. 5 shows the zinc concentration dependence of peak transverse (circles) and longitudinal (diamonds) ME coefficients in NZFO-PZT layered samples. The Figure contains the same data as FIGS. 4A and 4B. The line is guide to the eye.

The variations of peak values of $\alpha_E$ with x are plotted in FIG. 5. The data reveal a 60% increase in the transverse ME voltage coefficient as x was increased from 0 to 0.2, followed by a reduction in $\alpha_{E,31}$ for higher x. The longitudinal coefficient also showed a similar decrease with increasing x for x>0.2. The present values of $\alpha_E$ for the NZFO-PZT layered samples were significantly higher than reported values in past studies on bulk or layered samples. The coupling coefficient must be compared with 80 mV/cm Oe for NFO-barium titanate (Van den Boomgaard, et al., J. Mater. Sci. 9: 1705 (1974); Van den Boomgaard, et al., Ferroelectrics 14: 727 (1976); Van den Boomgaard and Born, J. Mater. Sci. 13: 1538 (1978)), 115 mV/cm Oe for NFO-PZT bulk composites (Ryu et al., J. Elec. Ceramics 7: 17 (2001)), and 300–400 mV/cm Oe for NFO-PZT bilayers and multilayers (Lupeiko et al., Inorganic Materials 31: 1245 (1995); Srinivasan et al., Phys. Rev. B 64: 214408 (2001) and Example 6).

Figure 6A:
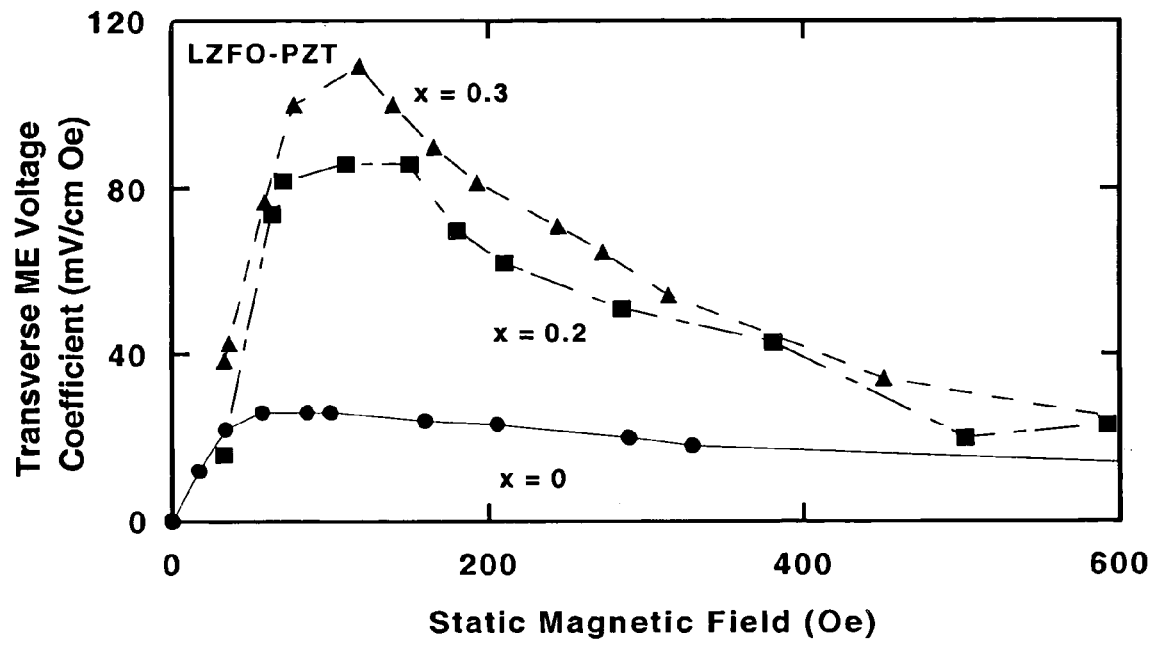
FIG. 6A shows the transverse voltage coefficient versus H profiles as in FIGS. 1 and 4, but for multilayer samples of $Li_{0.5-x/2}Zn_xFe_{2.5-x/2}O_4$ (LZFO)-PZT with x=0.0 (circles), x=0.2 (squares), and x=0.3 (triangles).
Figure 6B:
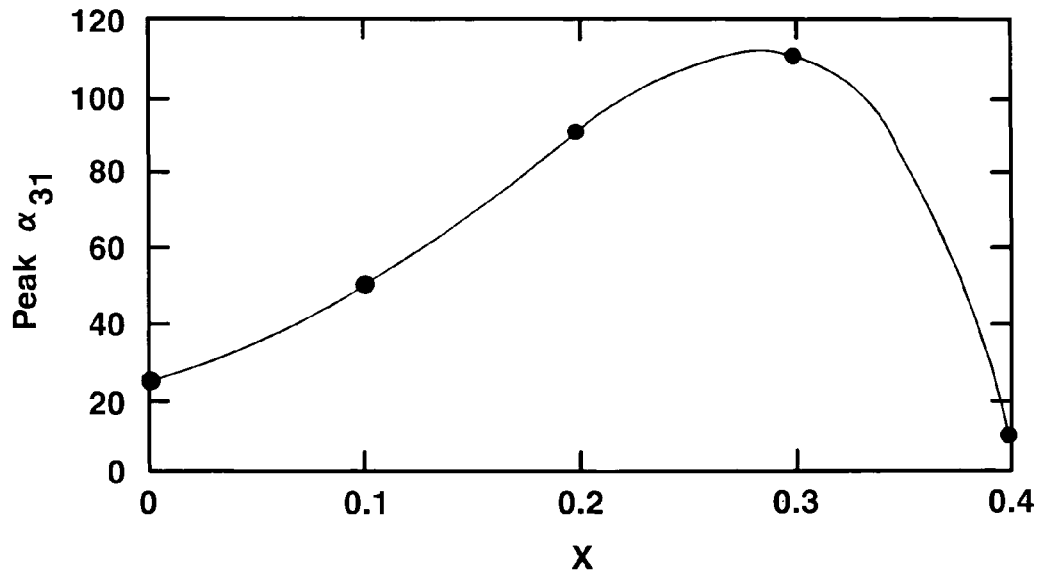
FIG. 6B shows the peak value of $\alpha_{E,31}$ vs x of the $Li_{0.5-x/2}Zn_xFe_{2.5-x/2}O_4$ (LZFO)-PZT samples of FIG. 6A.

Finally, lithium zinc ferrite-PZT composites were analyzed. Samples with n=10 and 15, a layer thickness of 15 micron and ferrites of composition $Li_{0.5-x/2}Zn_xFe_{2.5-x/2}O_4$ for x=0–0.4 were synthesized. FIG. 6A shows data on H-variation of the transverse ME voltage coefficient for x=0–0.3. The data are for a frequency of 100 Hz at room temperature. These data constitute the first report of strong ME coupling in lithium ferrite-PZT composites of any kind. Important observations were as follows: (i) data showed features similar to the other two systems, (ii) a factor of five increase in the peak $\alpha_{E,31}$ value was evident when x was increased from 0 to 0.3, and (iii) an up-shift in the H-value corresponding the peak $\alpha_{E,31}$ was seen as x was increased from 0 (recall that for CZFO-PZT and NZFO-PZT samples, a down-shift in H for maximum $\alpha_{E,31}$ was observed for increasing x), and (iv) the H-interval for strong ME effects was essentially independent of x. FIG. 6B shows data on peak values of $\alpha_{E,31}$ vs x. The Figure shows that there was a rapid increase in the ME voltage coefficient with x for x=0–0.3, followed by a sharp decrease for x=0.4.

Now the ME voltage coefficient data for the multilayer structures were compared and contrasted. Although all the three systems showed enhancement in the strength of ME coupling with Zinc substitution in the ferrite phase, the largest increase occurs for CZFO-PZT samples, followed by LZFO-PZT and NZFO-PZT. The highest ME voltage coefficients were measured for Zinc substitutions in the range x=0.2–0.4, depending on the nature of ferrite. The ME coupling was present over a wide H-interval in CZFO-PZT compared to the other two samples. A dramatic shift in the H-value corresponding to peak $\alpha_{E,31}$ for CZFO-PZT was observed. The field shift in the other two samples was relatively small. The strongest ME coupling was observed in NZFO-PZT where as LZFO-PZT samples showed the weakest effect.

III. DISCUSSION

It is reasonable to interpret the data in FIGS. 1–6 in terms of variations in magnetic properties of the ferrite since the results described in he results section are on H dependence of the ME coupling. Recall that the sample and materials parameters for the piezoelectric oxide remained the same for all the composites. It is clear that one needs to focus in on changes in the magnetic parameters of the ferrites when Zinc replaces either 3-d ions or Li. We first estimate the magnetoelectric voltage coefficients and their bias magnetic field dependence for comparison with data. Following this, we discuss the possible cause of zinc substitution related enhancement in ME effects.

For theoretical calculation of $\alpha_E$, a basic bilayer structure of ferrite-PZT is considered. Assuming the bilayer to be a free body with perfectly bonded interface with uniform H and zero electric field in the ferrite, one obtains the following expressions for the transverse and longitudinal ME coefficients (Harshe et al., Int. J. Appl. Electromag. Mater. 4: 145 (1993); Avellaneda and Harshe, J. Intell. Mater. Syst. Struct. 5: 501 (1994); Harshe, *Magnetoelectric effect in piezoelectric-magnetostrictive composites*, PhD thesis, The Pennsylvania State University, College Park, Pa., (1991)):

$$\alpha_{E,31} = \delta E_3/\delta H_1 = -2d^p_{31}q^m_{11}(s^m_{11}+s^m_{12})\epsilon^{T,p}_{33}+(s^p_{11}+s^p_{12})\epsilon^{T,p}_{33}-2(d^p_{31})^2 \quad (1)$$

and $$\alpha_{E,33} = \delta E_3/\delta H_3 = -2d^p_{31}q^m_{13}(s^m_{11}+s^m_{12})\epsilon^{T,p}_{33}+(s^p_{11}+s^p_{12})\epsilon^{T,p}_{33}-2(d^p_{31})^2 \quad (2)$$

Here m denotes the magnetostrictive phase and p the piezoelectric phase, d and q are the piezoelectric and piezomagnetic coupling coefficients, respectively, s is the compliance coefficient and $\epsilon^T$ is permittivity at constant stress. Equations (1) and (2) are valid for equal volumes of m-phases and p-phases and are for unit thickness of PZT. The voltage coefficients $\alpha_{E,31}$ and $\alpha_{E,33}$ arise due to parallel ($q_{11}$) and perpendicular ($q_{13}$) piezomagnetic coupling constants, respectively. Thus one requires the magnitude of $q=\delta\lambda/\delta H$ (where $\lambda$ is the magnetostriction) and its variation with H for the estimation of filed dependence of $\alpha_E$. The perpendicular magnetostriction, $\lambda_{13}$ and its derivative with H, $q_{13}$ were quite small. Consequently, the longitudinal ME coupling is expected to be weaker than the transverse case, as is the case from data in FIG. 1–5. The discussion to follow is therefore restricted to the transverse ME effect.

Figure 7A:
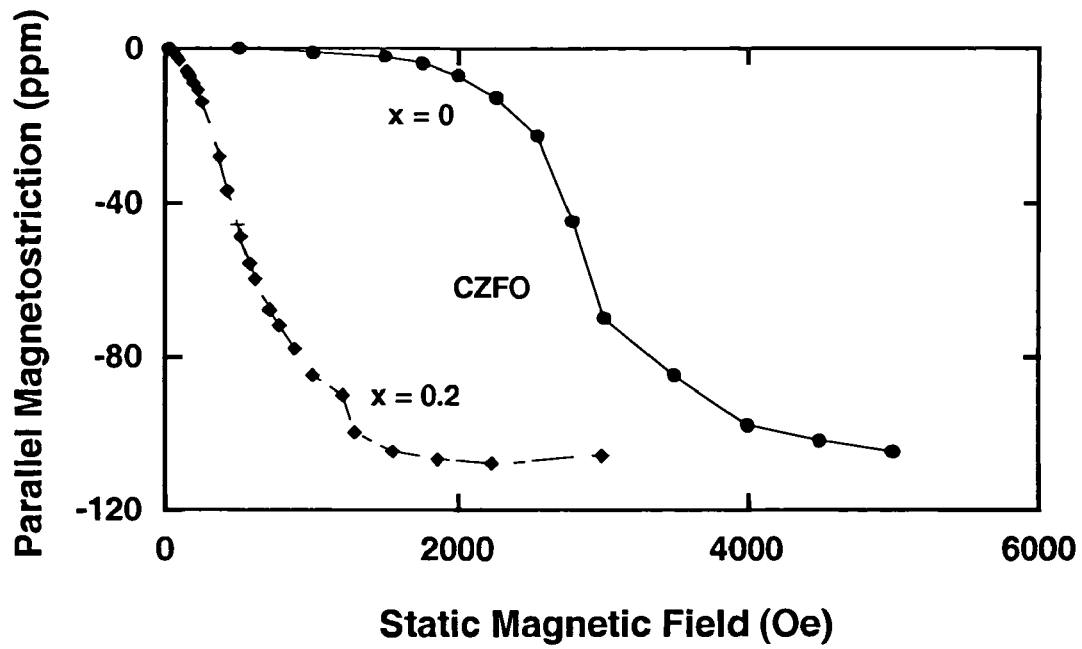
FIG. 7A shows the magnetostriction measured parallel to the applied field versus H for CZFO bulk samples made from thick films with x=0.0 (circles) and x=0.2 (diamonds). The data are at room temperature and for H parallel to the sample plane.
Figure 7B:
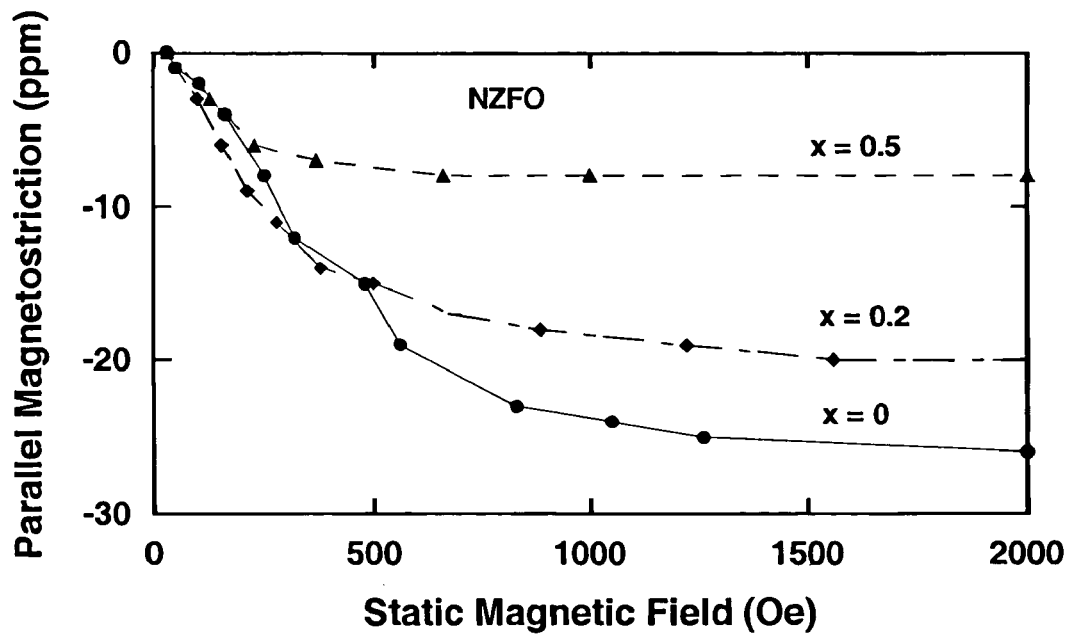
FIG. 7B shows the magnetostriction measured parallel to the applied field versus H for NZFO bulk samples made from thick films with x=0.0 (circles), x=0.2 (diamonds), and x=0.5 (triangles). The data are at room temperature and for H parallel to the sample plane.
Figure 7C:
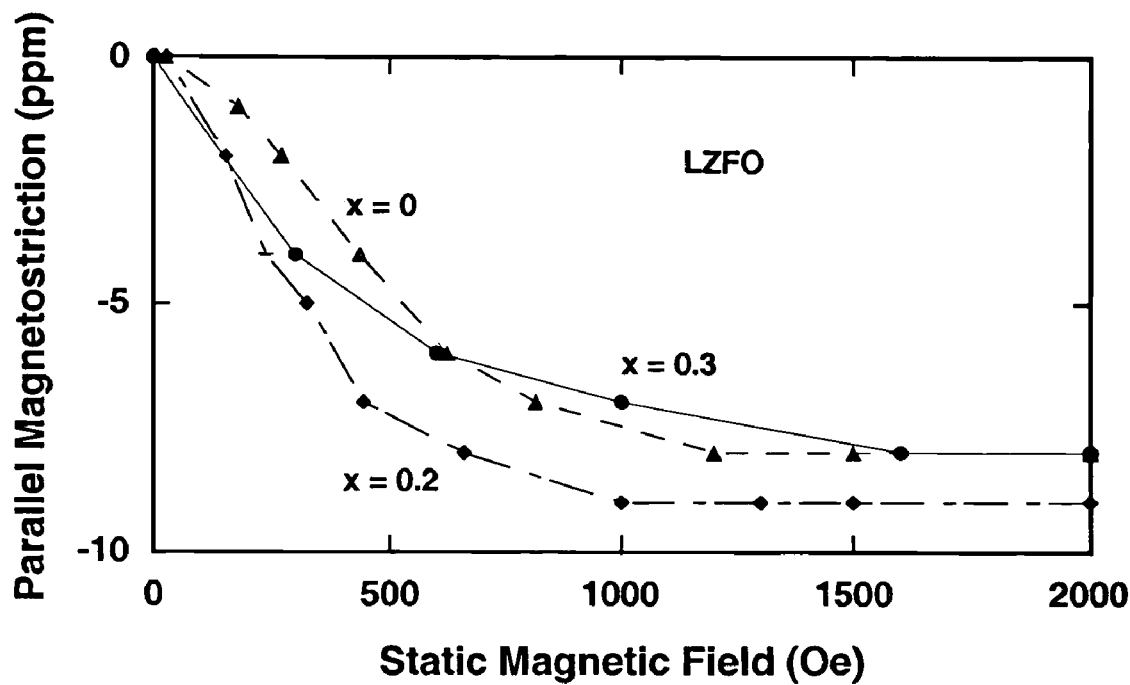
FIG. 7C shows the magnetostriction measured parallel to the applied field versus H for LZFO bulk samples made from thick films with x=0.0 (triangles), x=0.2 (diamonds), and x=0.3 (circles). The data are at room temperature and for H parallel to the sample plane.

The q-values were determined from data on $\lambda$ vs H for the pure and Zinc substituted ferrites. Representative data on the in-plane parallel magnetostriction $\lambda_{11}$ used for $q_{11}$ are shown in FIGS. 7A, 7B, and 7C for CZFO, NZFO and LZFO bulk samples, respectively. The measurements were made with the standard strain gage technique at room temperature on ferrites (1 cm×1 cm×0.05 cm) made from thick films.

Figure 7D:
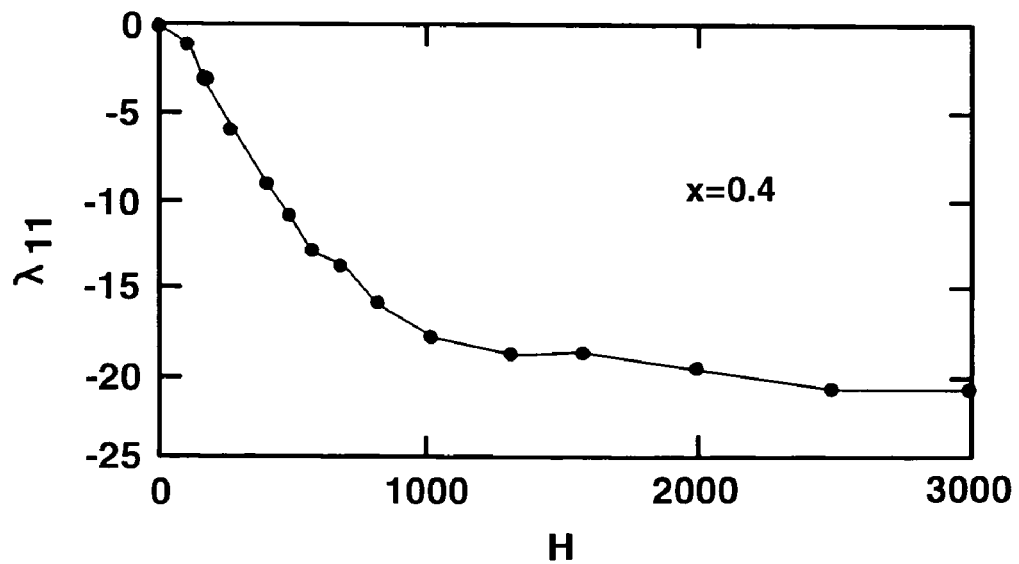
FIG. 7D shows $\lambda_{11}$ vs H for CZFO(x=0.4)-PZT.

Consider first the magnetostriction for CZFO samples (FIG. 7A). For x=0, as H was increased there was a weak increase in the magnitude of $\lambda$ for fields up to 2 kOe which was followed by a strong increase for H over the interval 2–4 kOe. The $\lambda$-value leveled off and became saturated for H>4 kOe. When 20% Co was replaced with Zinc, there was a dramatic strengthening of low field piezomagnetic coupling in the ferrite. The magnetostriction increased rapidly with H for fields up to 2 kOe. The saturation $\lambda$ was the same as for x=0, but the saturation occurred at a much smaller H compared to CFO. A further increase in x resulted in a decrease in the saturation $\lambda$, but q remained high since the saturation field decreased progressively with increasing x. Thus with the introduction of Zinc in CFO, there was an increase in the strength of piezomagnetic coupling and a reduction in the saturation value of $\lambda$. FIG. 7D shows that at x=0.4, $\lambda_{11}$ decreased as H was increased.

The substitution of Zinc in NFO or LZFO resulted in changes that were less dramatic than those for CFO substituted with Zinc. Data in FIG. 7B show an overall decrease in the saturation $\lambda$ and H value for saturation with increasing x in NZFO. For x=0.2, there was an increase in the low field piezomagnetic coupling ($\delta\lambda/\delta H$) compared to NFO.

Data for LZFO (FIG. 7C) indicated no changes in the saturation $\lambda$ with increasing Zinc substitution for x=0–0.3. But both the low field $\lambda$ and q increased with increasing x. The highest $\lambda$ was measured for CZFO and the lowest for LZFO.

The bilayer model can be used for a theoretical calculation of $\alpha_{E,31}$ for comparison with the data. The following material parameters were used for the constituent phases (Harshe et al., Int. J. Appl. Electromag. Mater. 4: 145 (1993); Avellaneda and Harshe, J. Intell. Mater. Syst. Struct. 5: 501 (1994); Srinivasan et al., Phys. Rev. B 64: 214408 (2001)

and Example 6; Landolt-Börnstein: *Numerical data and functional relationships in science and technology, Group III, Crystal and Solid State Physics*, vol 4(b), *Magnetic and Other Properties of Oxides*, eds. Hellwege and Springer, Springer-Verlag, New York (1970)).

| | | | |
|---|---|---|---|
| PZT, | $s^P_{11} = 14 \times 10^{-12}$ m²/N | Ferrites, | $s^m_{11} = 6.5 \times 10^{-12}$ m²/N |
| | $s^P_{12} = -8 \times 10^{-12}$ m²/N | | $s^m_{12} = -2.4 \times 10^{-12}$ m²/N. |
| | $\epsilon^{T,P}_{33} = 17 \times 10^{-9}$ F/m. | | |

Figure 8A:
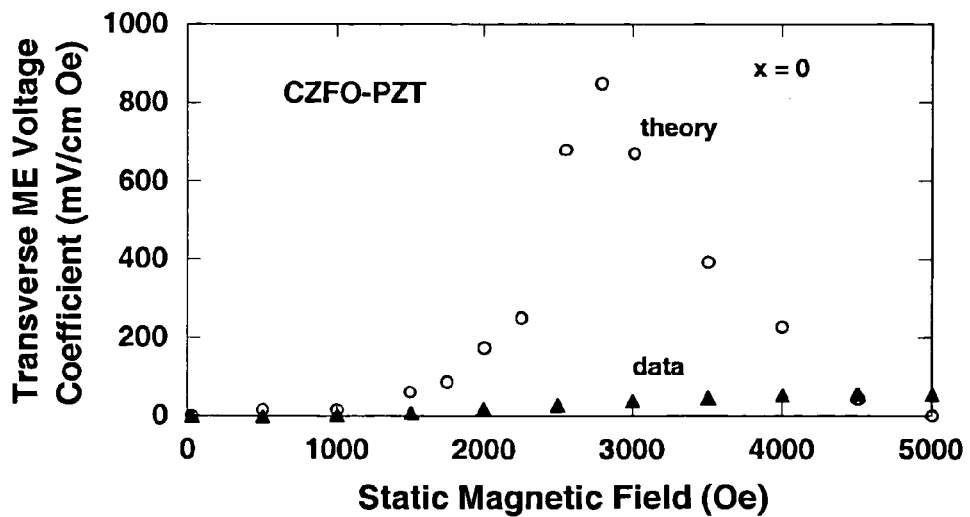
FIG. 8A shows a comparison of theoretical (circles) and measured values (triangles) of the transverse ME voltage coefficient $\alpha_{E,31}$ for layered samples of CZFO-PZT wherein x=0.0.
Figure 8B:
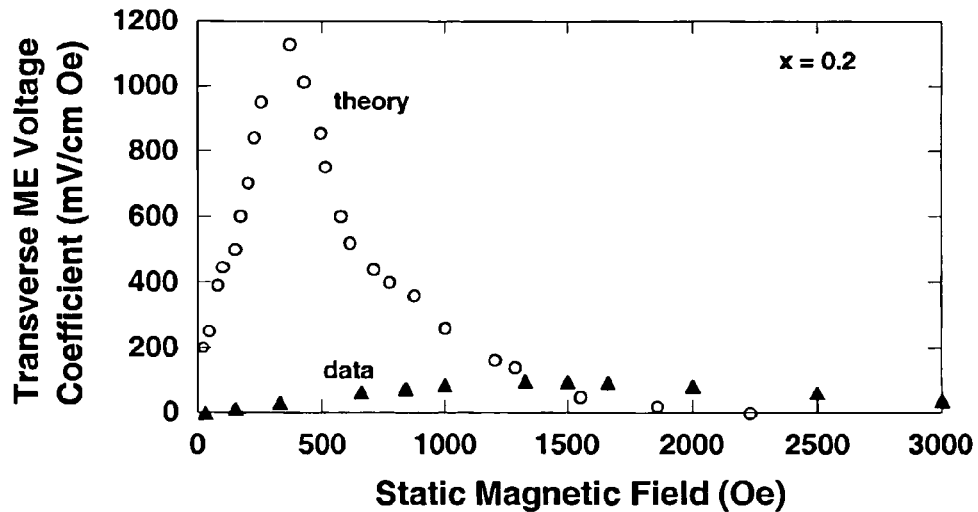
FIG. 8B shows a comparison of theoretical (circles) and measured values (triangles) of the transverse ME voltage coefficient $\alpha_{E,31}$ for layered samples of CZFO-PZT wherein x=0.2.

Measured values of the piezoelectric coupling coefficient $d_{33}$ for the multilayers ranged from 70 to 170 pm/V at 100 Hz and an average value of $d_{31}=d_{33}/2=60$ pm/V was used. The other required parameter, q, was determined from data in FIGS. 7A, 7B, 7C, and 7D. Calculated values of $\alpha_{E,31}$ are compared in FIGS. 8A, 8B, and 8C with the data for CZFO-PZT samples. Results are shown for samples with x=0, 0.2 and 0.4. For CFO-PZT (x=0), the theory predicted a gradual increase in $\alpha_{E,31}$ with increasing H. A maximum in $\alpha_{E,31}$ was expected for a field of 3 kOe and the ME coefficient drops down to zero value for H=5 kOe. Upon increasing x from 0 to 0.2, significant theoretical predictions concerned a rapid increase in the low field $\alpha_{E,31}$, down-shift in the peak position to 400 Oe and a maximum $\alpha_{E,31}$ value that was 25% larger than for x=0. Finally, for x=0.4, the calculated $\alpha_{E,31}$ vs H revealed a further shift to low H for the peak in $\alpha_{E,31}$, a rapid fall-off in $\alpha_{E,31}$ at higher fields, and a maximum $\alpha_{E,31}$ which was a factor of 4–5 smaller than for the cobalt rich compositions. The theoretical $\alpha_{E,31}$ vs H tracked the slope of λ vs H as shown in FIGS. 7A, 7B, 7C, and 7D.

Figure 8C:
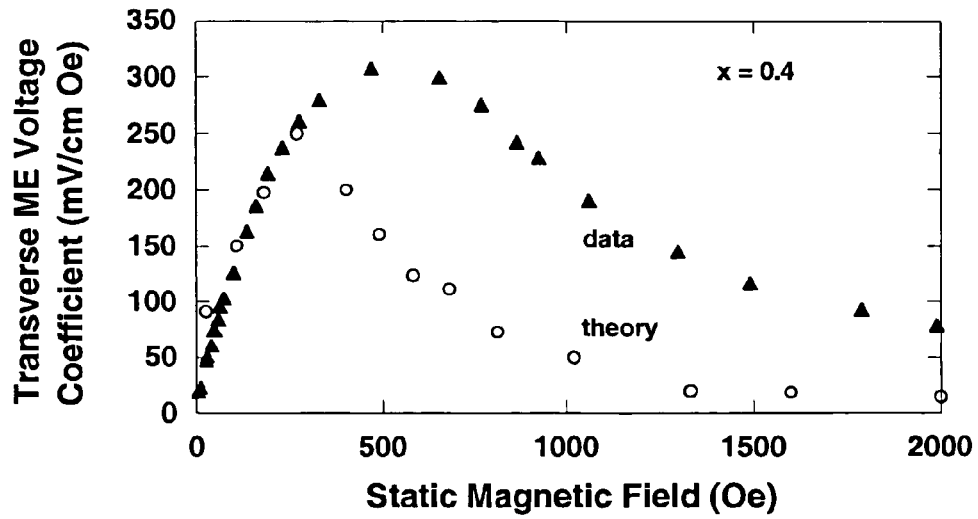
FIG. 8C shows a comparison of theoretical (circles) and measured values (triangles) of the transverse ME voltage coefficient $\alpha_{E,31}$ for layered samples of CZFO-PZT wherein x=0.4.

The data and theoretical values of $\alpha_{E,31}$ for CZFO-PZT were compared. For x=0–0.2, there was a substantial disagreement between theory and data. Neither the magnitude nor the H dependence of calculated $\alpha_{E,31}$ agreed with the data. The predicted values were an order of magnitude higher and H-values for maximum $\alpha_{E,31}$ were a factor of 2–3 smaller than the measured values. The most significant inference from FIGS. 8A, 8B, and 8C was the agreement between theory and data only for x=0.4 (FIG. 8C). In particular, theoretical and measured $\alpha_{E,31}$ values were identical over the field interval 0–300 Oe. For higher fields, the measured values were somewhat higher than the theoretical values. The data shows a maximum in $\alpha_{E,31}$ for a H-value that was slightly higher than predicted by theory.

Figure 9A:
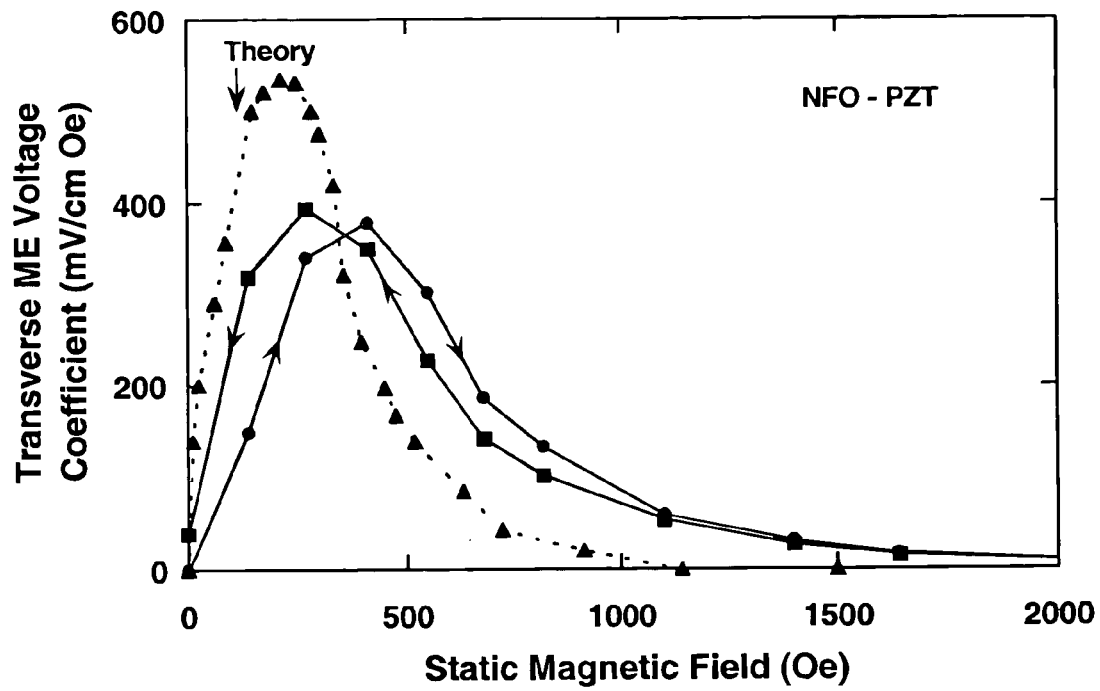
FIG. 9A shows the theoretical (triangles) and measured $\alpha_{E,31}$ versus H for NFO(x=0.0)-PZT multilayer composites. The circles are increasing H and the squares are decreasing H.
Figure 9B:
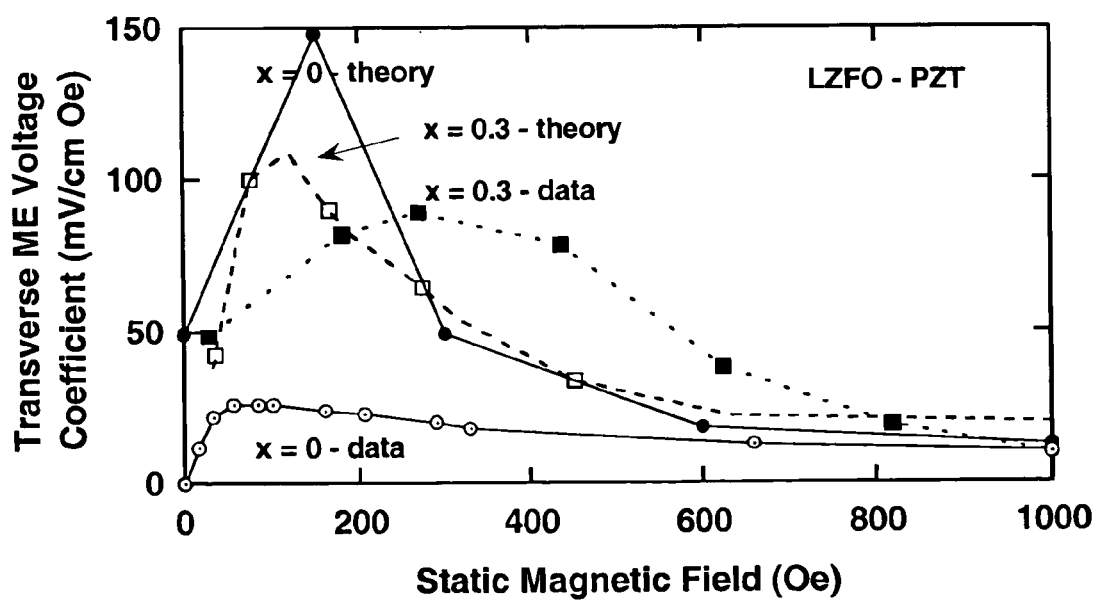
FIG. 9B shows the theoretical and measured $\alpha_{E,31}$ versus H for LZFO-PZT multilayer composites with x=0.3 data (filled squares), x=0.3 theory (open squares), x=0.0 data (open circles), and x=0.0 theory (filled circles).

A similar comparison for NZFO-PZT samples, however, indicated excellent agreement between theory and data for pure nickel ferrite and the entire series of Zinc substitution. Representative results are shown in FIGS. 9A and 9B for NFO(x=0)-PZT. Data on $\alpha_{E,31}$ are shown for both increasing and decreasing H. Theoretical estimates are for q-values obtained from magnetostriction data in FIGS. 7A, 7B, and 7C and other material parameters mentioned earlier for ferrites. Both the magnitude and H dependence agreed with the data. The theory predicted a maximum in $\alpha_{E,31}$ which was 20% higher than the data and the maximum occurred for an H-value lower than the observed field.

Finally, a comparison of data and theory in FIGS. 9A and 9B for LZFO-PZT samples yielded results similar to CZFO-PZT samples. For x=0, there was a factor of six difference between the calculated and experimental values of $\alpha_{E,31}$. When Zinc replaced both Fe and Li, there was overall agreement in $\alpha_{E,31}$ values as evident from results in FIGS. 9A and 9B for x=0.3.

There are several common features in the theoretical estimates for the three systems. First, for composites containing pure ferrites, such as CFO-PZT or LFO-PZT, there was a total lack of agreement between theory and data. Although magnetostriction data implied a strong piezomagnetic coupling, the magnetoelectric coupling was almost an order of magnitude weaker than predicted values. The notable exception, however, was NFO-PZT which showed good agreement. Second, the introduction of Zinc led to an enhancement in the strength of ME coupling and there was good agreement between theory and data for Zinc rich compositions of both CZFO-PZT and LZFO-PZT samples. Third, the theoretical value of H corresponding to the peak in $\alpha_{E,31}$ was smaller than the measured values for all the compositions. Fourth, the high field values of $\alpha_{E,31}$ were smaller than the data. The final two observations could have been the result of an over simplified model that was meant for a bilayer structure.

Example 6 provides an analysis of ME coupling in bilayer and multilayer NFO-PZT. The effective thickness of NFO and PZT was kept constant for both samples. There was a down-shift in H corresponding to the maximum in $\alpha_{E,31}$ and a sharp drop in high field $\alpha_{E,31}$ for the bilayer compared to multilayers (Srinivasan et al., Phys. Rev. B 64: 214408 (2001) and Example 6). It was important to examine the influence of ferrite-PZT interfaces in the theoretical model since there were n interfaces in a multilayer with (n+1) ferrites and n PZT layers. One would expect a stronger interface coupling in multilayers than in bilayers.

Figure 10:
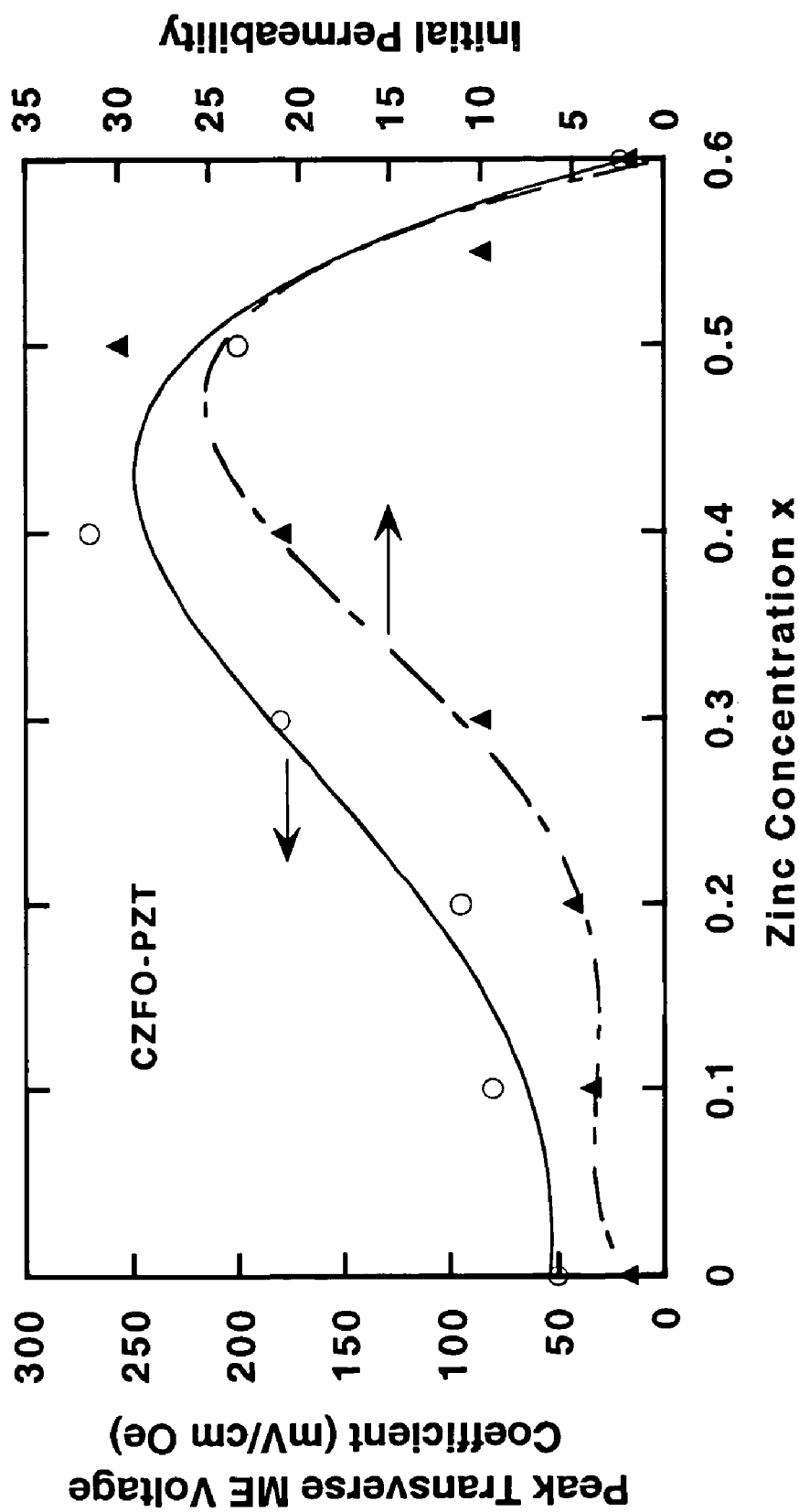
FIG. 10 shows a composition dependence of $\alpha_{E,31}$ and initial permeability (from Toltinnikov and Davydov, Soviet Phys. Solid State 6: 1730 (1965)) for CZFO-PZT multilayers with $\alpha_{E,31}$ (circles) and $\mu_i$ (triangles).

Consider next that the lack of agreement between theory and data for pure or low-Zn compositions of CZFO-PZT and LZFO-PZT implied weak ME coupling mediated by magnetostriction. There are two types of magnetostriction in a ferromagnet: (i) Joule magnetostriction associated with domain movements and (ii) volume magnetostriction associated with magnetic phase change. The volume magnetostriction is not important in the present situation since it is significant only at temperatures close to the Curie temperature and for high applied fields. In ferrites, domains are spontaneously deformed in the magnetization direction. Under the influence of a bias field H and ac field δH, both the growth in the domains with favorable orientation and domain rotation contribute to the Joule magnetostriction. Since the ME coupling involves dynamic magnetoelastic coupling, key requirements for the ferrite phase are unimpeded domain wall motion, domain rotation and a large λ. A soft, high initial permeability (low anisotropy) ferrite, such as NFO, is the main ingredient for strong ME effects. In magnetically hard cobalt ferrite, however, one has the disadvantage of a large anisotropy field that limits domain rotation. Our magnetization measurements yielded an initial permeability of 20 for NFO vs 3.5 for CFO. Thus one can relate the strong ME effects in NFO-PZT and poor ME coupling in CFO-PZT to the initial permeability $\mu_i$. With the substitution of Zinc in CFO, the anisotropy decreased and $\mu_i$ increased. FIG. 10 shows the composition dependence of $\mu_i$ in CZFO. With an increase in x, $\mu_i$ (from Toltinnikov and Davydov, Soviet Phys. Solid State 6: 1730 (1965)) increased and had a maximum value when x=0.5. FIG. 10 also shows the variation of maximum $\alpha_{E,31}$ with x for comparison. There was excellent correlation between the initial permeability and the strength of ME coupling. The maximum in both $\mu_i$ and $\alpha_{E,31}$ occurred around the same composition, i.e., x=0.4–0.5. Thus it is logical to associate the agreement between theory and data in FIGS. 8A, 8B, and 8C for Zn-rich CZFO-PZT with efficient dynamic magnetoelastic coupling that resulted from domain mobility. The bilayer model used here, however, does not predict a direct relationship between $\mu_i$ and $\alpha_{E,31}$ (Harshe et al., Int. J. Appl. Electromag. Mater. 4: 145 (1993); Avellaneda and Harshe, J. Intell. Mater. Syst. Struct. 5: 501 (1994)). Recent theoretical models for multilayer ferrite-PZT composites do reveal the anticipated dependence of ME coupling on initial permeability.

Zinc substitution can also influence the coupling at the ferrite-PZT interface. Since the ME effect is an interface phenomenon, coupling is likely to be adversely affected by any defects, either structural or chemical, and growth induced strain. Defects and strain increase magnetic anisotropy, pin the domain and limit wall motion and rotation. Zinc substituted composites were sintered at a lower temperature compared to pure ferrite-PZT samples, possibly resulting in fewer interface defects and reduced strain. Investigations on the microscopic nature of the ferrite-PZT interfaces with techniques such as electron microscopy and magnetic force microcopy are critically important for an understanding of the Zinc substitution related interface aspects of the observations.

IV. CONCLUSIONS

Studies on layered samples of zinc substituted ferrites and PZT showed efficient field conversion characteristics. The magnetoelectric voltage coefficient $\alpha_E$ measured from induced voltage for an applied magnetic field showed an overall increase with increasing Zinc concentration (x) in CZFO-PZT, NZFO-PZT and LZFO-PZT samples. A maximum in $\alpha_E$ occurred for x=0.2–0.4, depending on the ferrite. Theoretical estimates of $\alpha_E$ were in very good agreement with data only for NZFO-PZT and Zinc rich compositions of CZFO-PZT and LZFO-PZT. There was excellent correlation between $\alpha_E$ and initial permeability for CZFO-PZT. The Zinc assisted enhancement in ME coupling is attributed to low anisotropy and high permeability for the ferrites that results in favorable domain dynamics and strong piezomagnetic coupling in the composites.

EXAMPLE 2

This example illustrates the formation of nickel zinc ferrite-lead zirconate titanate (NZFO-PZT) bilayers and multilayers. Both NZFO-PZT bilayers and multilayers were synthesized from thick films prepared by tape casting. The process involved (i) preparation of submicron-sized powder of nickel zinc ferrite (NZFO) and lead zirconate titanate (PZT), (ii) thick-film tapes by doctor-blade techniques, and (iii) lamination and sintering of bilayers and multilayers.

NZFO powder was obtained by standard ceramic techniques and commercial PZT (Sample No. APC850) was obtained from American Piezo Ceramics, Inc., Mackeyville, Pa.) were used. For tape casting (Mistler et al., In *Tape Casting: Theory and Practice* (American Ceramics Society, Westerville, Ohio, 2000), powders of NZFO and PZT were each mixed with a solvent such as ethyl alcohol and a dispersant such as Blown Menhaden fish oil (available from Richard E. Mistler, Inc., Morrisville, Pa.) and ball milled for 24 hours, followed by a second ball mill with a plasticizer such as butyl benzyl phthalate and a binder such as polyvinyl butyral for 24 hours to produce a slurry of NZFO and a slurry of PZT. The slurries were each separately cast into tapes of either NZFO or PZT on a carrier film such as silicon-coated mylar sheets using doctor-blade techniques. That is the slurries were cast into tapes on a carrier film using a tape caster consisting of a pair of stationary micrometer-controlled blades and a moveable casting bed such as that available from Richard E. Mistler, Inc. In general, it was possible to obtain 10×20 cm$^2$ tapes with a thickness within the range of about 10 to 200 μm. The NZFO and PZT tapes were then arranged to obtain the desired structure, a bilayer consisting of an NZFO and a PZT tape or multilayers consisting of alternating layers of NZFO and PZT tapes. The bilayer or multilayer structures were laminated under high pressure between about 210 Kgf/cm$^2$ and 352 Kgf/cm$^2$ (3000 and 5000 psi) and under high temperature of about 400° K. The laminated bilayer or multilayer structures were then heated at about 1000° K to evaporate the binder. The final sintering of the laminated bilayer or multilayer was then carried out at between about 1400 and 1500° K.

Bilayers were made with 200-μm-thick films of NZFO and PZT. Multilayers consisted of alternate layers of NZFO and PZT totaling n+1 layers of NZFO and n layers of PZT (n=5 to 29), with a layer thickness of 10 to 20 μm. Structural studies were done with x-ray diffraction on multilayers, crushed powder samples, and samples with exposed interface by etching away the top layer. There was no evidence of any impurity phase. Magnetic parameters such as the saturation magnetism, anisotropy, and g value were in agreement with values expected. Thus the high temperature processing did not result in any impurity phases or degradation of the quality of the magnetic phase.

EXAMPLE 3

This example illustrates the formation of cobalt zinc ferrite-lead zirconate titanate (CZFO-PZT) bilayers and multilayers. Both CZFO-PZT bilayers and multilayers were synthesized from thick films prepared by tape casting. The process involved (i) preparation of submicron-sized powder of cobalt zinc ferrite (CZFO) and lead zirconate titanate (PZT), (ii) thick-film tapes by doctor-blade techniques, and (iii) lamination and sintering of bilayers and multilayers.

CZFO powder was obtained by standard ceramic techniques and commercial PZT (Sample No. APC850) was obtained from American Piezo Ceramics, Inc., Mackeyville, Pa.) were used. For tape casting, powders of CZFO and PZT were each mixed with a solvent such as ethyl alcohol and a dispersant such as Blown Menhaden fish oil and ball milled for 24 hours, followed by a second ball mill with a plasticizer such as butyl benzyl phthalate and a binder such as polyvinyl butyral for 24 hours to produce a slurry of CZFO and a slurry of PZT. The slurries were each separately cast into tapes of either CZFO or PZT on a carrier film such as silicon-coated mylar sheets using doctor-blade techniques. That is the slurries were cast into tapes on a carrier film using a tape caster consisting of a pair of stationary micrometer-controlled blades and a moveable casting bed. In general, it was possible to obtain 10×20 cm$^2$ tapes with a thickness within the range of about 10 to 200 μm. The CZFO and PZT tapes were then arranged to obtain the desired structure, a bilayer consisting of an CZFO and a PZT tape or multilayers consisting of alternating layers of CZFO and PZT tapes. The bilayer or multilayer structures were laminated under high pressure between about 210 Kgf/cm$^2$ and 352 Kgf/cm$^2$ (3000 and 5000 psi) and under high temperature of about 400° K. The laminated bilayer or multilayer structures were then heated at about 1000° K to evaporate the binder. The final sintering of the laminated bilayer or multilayer was then carried out at between about 1400 and 1500° K.

Bilayers were made with 200-μm-thick films of CZFO and PZT. Multilayers consisted of alternate layers of CZFO and PZT totaling n+1 layers of CZFO and n layers of PZT (n=5 to 29), with a layer thickness of 10 to 20 μm. Structural studies were done with x-ray diffraction on multilayers, crushed powder samples, and samples with exposed interface by etching away the top layer. There was no evidence of any impurity phase. Magnetic parameters such as the saturation magnetism, anisotropy, and g value were in agreement with values expected. Thus the high temperature processing did not result in any impurity phases or degradation of the quality of the magnetic phase.

EXAMPLE 4

This example illustrates the formation of lithium zinc ferrite-lead zirconate titanate (LZFO-PZT) bilayers and multilayers. Both LZFO-PZT bilayers and multilayers were synthesized from thick films prepared by tape casting. The process involved (i) preparation of submicron-sized powder of lithium zinc ferrite (LZFO) and lead zirconate titanate (PZT), (ii) thick-film tapes by doctor-blade techniques, and (iii) lamination and sintering of bilayers and multilayers.

LZFO powder was obtained by standard ceramic techniques and commercial PZT (Sample No. APC850) was obtained from American Piezo Ceramics, Inc., Mackeyville, Pa.) were used. For tape casting, powders of LZFO and PZT were each mixed with a solvent such as ethyl alcohol and a dispersant such as Blown Menhaden fish oil and ball milled for 24 hours, followed by a second ball mill with a plasticizer such as butyl benzyl phthalate and a binder such as polyvinyl butyral for 24 hours to produce a slurry of LZFO and a slurry of PZT. The slurries were each separately cast into tapes of either LZFO or PZT on a carrier film such as silicon-coated mylar sheets using doctor-blade techniques. That is the slurries were cast into tapes on a carrier film using a tape caster consisting of a pair of stationary micrometer-controlled blades and a moveable casting bed. In general, it was possible to obtain 10×20 cm$^2$ tapes with a thickness within the range of about 10 to 200 μm. The LZFO and PZT tapes were then arranged to obtain the desired structure, a bilayer consisting of an LZFO and a PZT tape or multilayers consisting of alternating layers of LZFO and PZT tapes. The bilayer or multilayer structures were laminated under high pressure between about 210 Kgf/cm$^2$ and 352 Kgf/cm$^2$ (3000 and 5000 psi) and under high temperature of about 400° K. The laminated bilayer or multilayer structures were then heated at about 1000° K to evaporate the binder. The final sintering of the laminated bilayer or multilayer was then carried out at between about 1400 and 1500° K.

Bilayers were made with 200-μm-thick films of LZFO and PZT. Multilayers consisted of alternate layers of LZFO and PZT totaling n+1 layers of LZFO and n layers of PZT (n=5 to 29), with a layer thickness of 10 to 20 μm. Structural studies were done with x-ray diffraction on multilayers, crushed powder samples, and samples with exposed interface by etching away the top layer. There was no evidence of any impurity phase. Magnetic parameters such as the saturation magnetism, anisotropy, and g value were in agreement with values expected. Thus the high temperature processing did not result in any impurity phases or degradation of the quality of the magnetic phase.

EXAMPLE 5

This examples provide data on the effect of Zn-substitution in the ferrite phase on magnetoelectric voltage coefficient in ferrite-PZT multilayers.

NZFO-PZT multilayers were made according to the method shown in Example 2, CZFO-PZT multilayers were made according to the method shown in Example 3, and LZFO-PZT multilayers were made according to the method shown in Example 4.

Figure 11A:
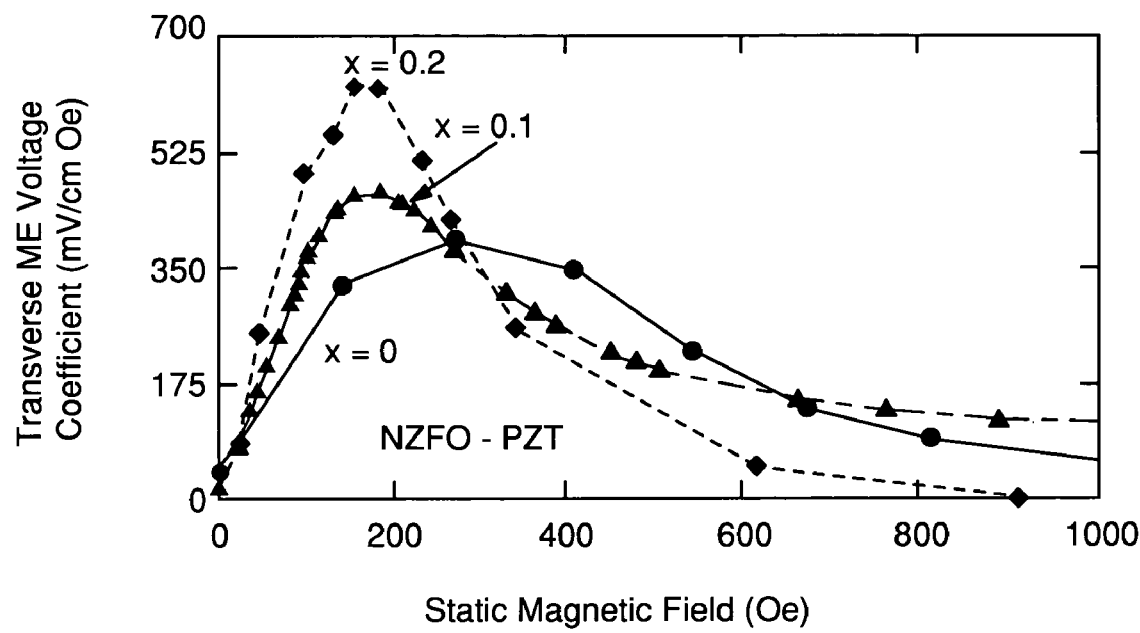
FIG. 11A shows the transverse magnetoelectric (ME) voltage coefficient verses static magnetic field (Oe) for nickel zinc ferrite-PZT (NZFO-PZT) multilayers for zinc concentrations of x=0.0 (filled circles), x=0.1 (triangles), and x=0.2 (diamonds). The Figure contains the same data as FIGS. 4A and 4B.

FIG. 11A shows the transverse magnetoelectric (ME) voltage coefficient verses static magnetic field (Oe) for nickel zinc ferrite-PZT (NZFO-PZT) multilayers for zinc concentrations of x=0.0 (filled circles), x=0.1 (triangles), and x=0.2 (diamonds).

Figure 11B:
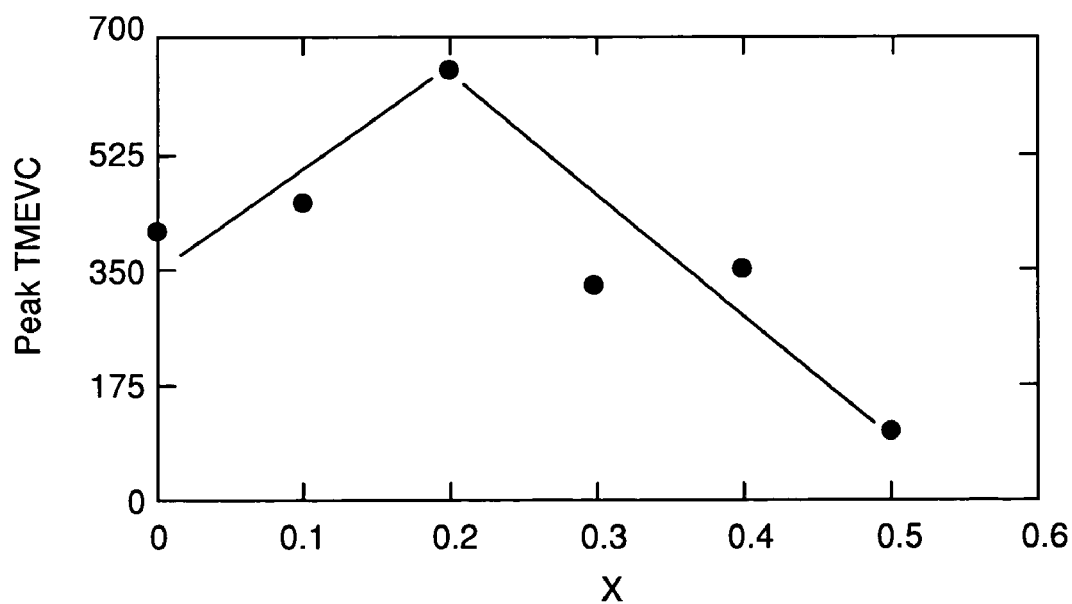
FIG. 11B shows the variation of the peak voltage coefficient with x for the NZFO-PZT multilayers of FIG. 11A. The Figure contains the same data as FIGS. 4A and 4B.

FIG. 11B shows the variation of the peak voltage coefficient with x for the NZFO-PZT multilayers of FIG. 11A.

Figure 12:
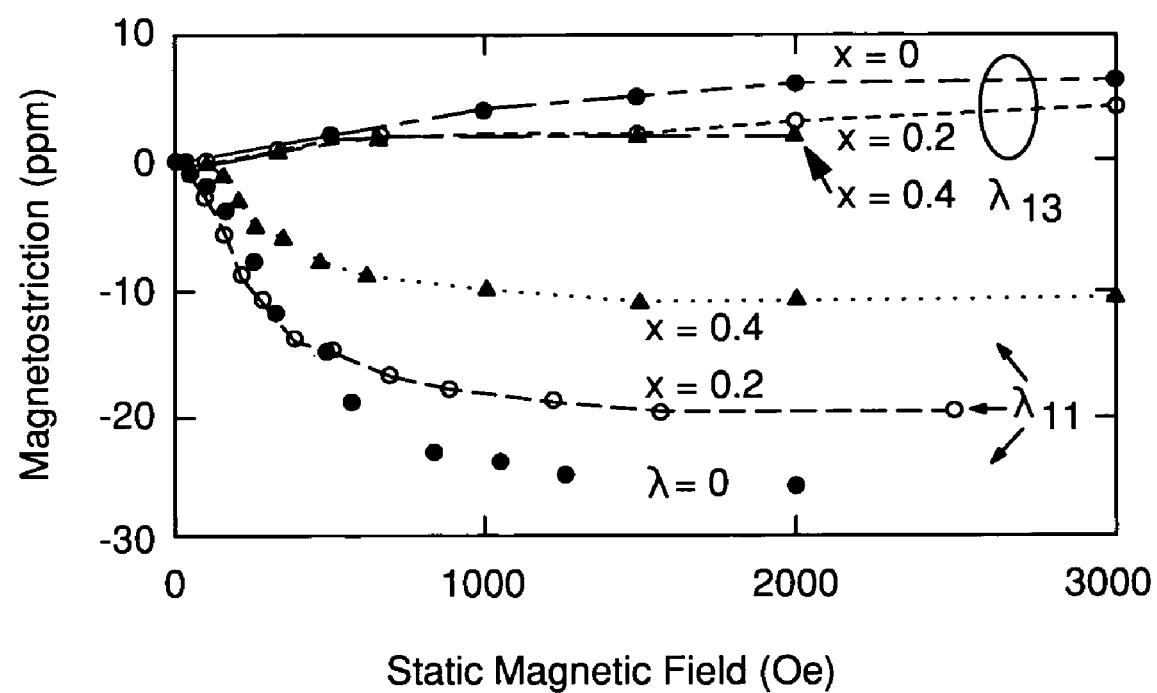
FIG. 12 shows parallel ($\lambda_{11}$) and perpendicular ($\lambda_{13}$) magnetostriction verses static magnetic field (Oe) for NZFO-PZT multilayers with x=0.0 (filled circles), x=0.2 (open circles), and x=0.5 (triangles).

FIG. 12 shows parallel ($\lambda_{11}$) and perpendicular ($\lambda_{13}$) magnetostriction verses static magnetic field (Oe) for NZFO-PZT multilayers with x=0.0 (filled circles), x=0.2 (open circles), and x=0.5 (triangles).

Figure 13:
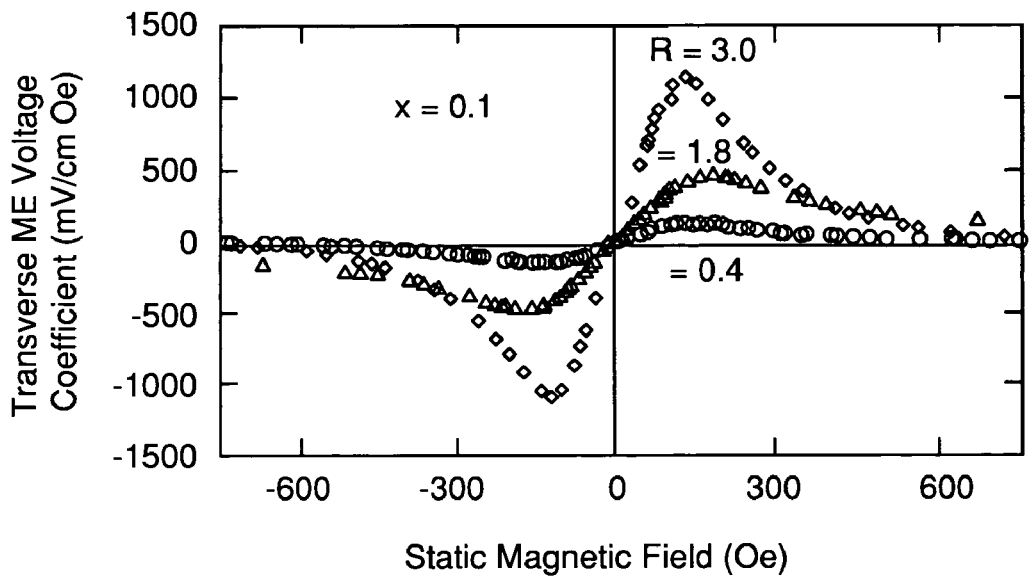
FIG. 13 shows the effect of volume ratio (R) wherein R=volume of ferrite/volume of PZT on the transverse voltage coefficient in nickel ferrite (x=0.1)-PZT multilayers with R=3.0 (diamonds), R=1.8 (triangles), and R=0.4 (circles).

FIG. 13 shows the effect of volume ratio (R) wherein R=volume of ferrite/volume of PZT on the transverse voltage coefficient in nickel ferrite (x=0.1)-PZT multilayers with R=3.0 (diamonds), R=1.8 (triangles), and R=0.4 (circles).

Figure 14:
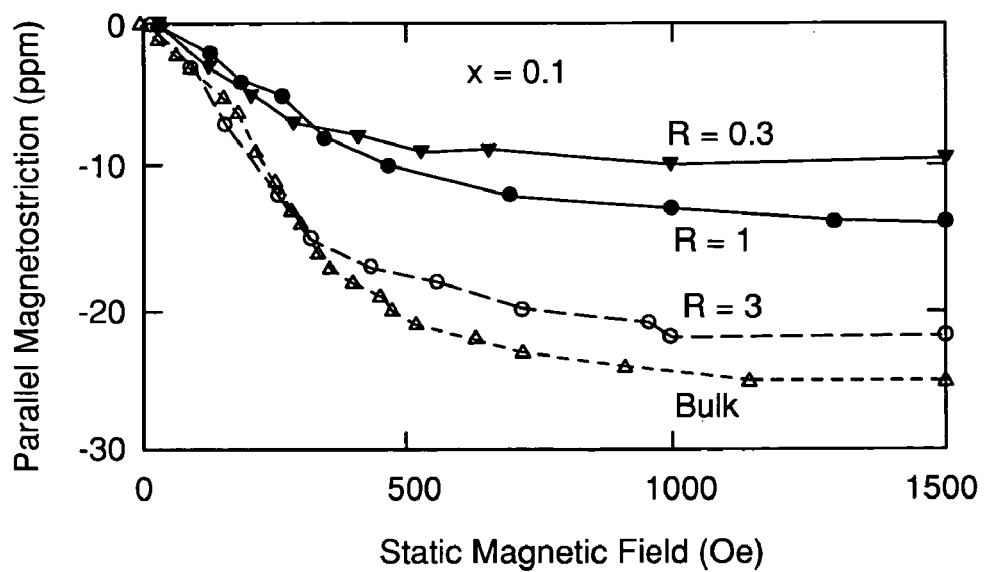
FIG. 14 shows parallel magnetostriction verses volume ratio (R) for NZFO(x=0.1)-PZT multilayers with R=0.3 (filled inverted triangles), R=1.0 (filled circles), R=3.0 (open circles), and bulk (open triangles).

FIG. 14 shows parallel magnetostriction verses volume ratio (R) for NZFO(x=0.1)-PZT multilayers with R=0.3 (filled inverted triangles), R=1.0 (filled circles), R=3.0 (open circles), and bulk (open triangles).

Figure 15A:
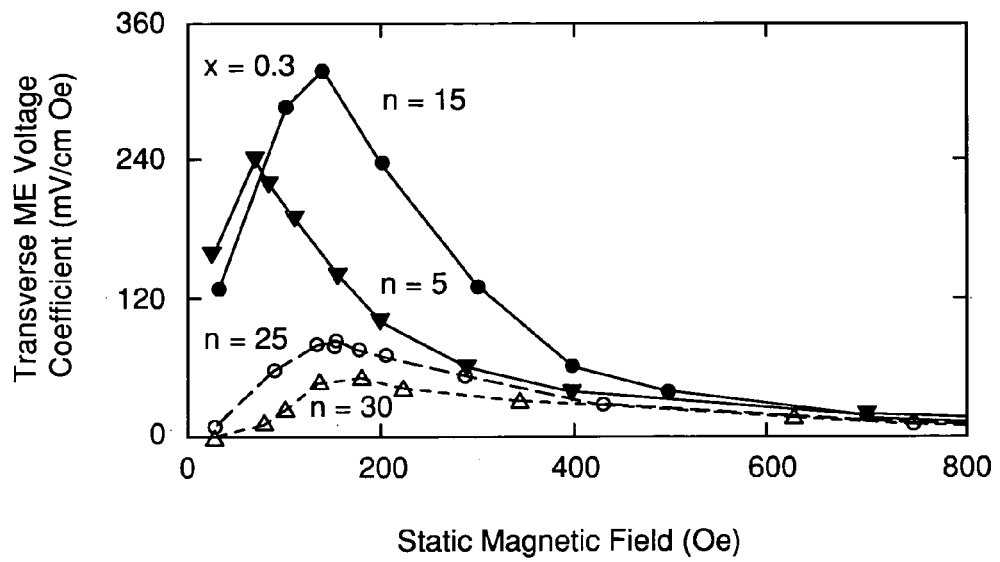
FIG. 15A shows the effect of ferrite layers (n) on the magnetoelectric (ME) voltage coefficient in NZFO(x=0.3)-PZT multilayers. The samples contained n bimetal ferrite and n−1 PZT layers with n=5 (filled inverted triangles), n=15 (filled circles), n=25 (open circles), and n=30 (open triangles).

FIG. 15A shows the effect of ferrite layers (n) on the magnetoelectric (ME) voltage coefficient in NZFO(x=0.3)-PZT multilayers. The samples contained n bimetal ferrite and n−1 PZT layers with n=5 (filled inverted triangles), n=15 (filled circles), n=25 (open circles), and n=30 (open triangles).

Figure 15B:
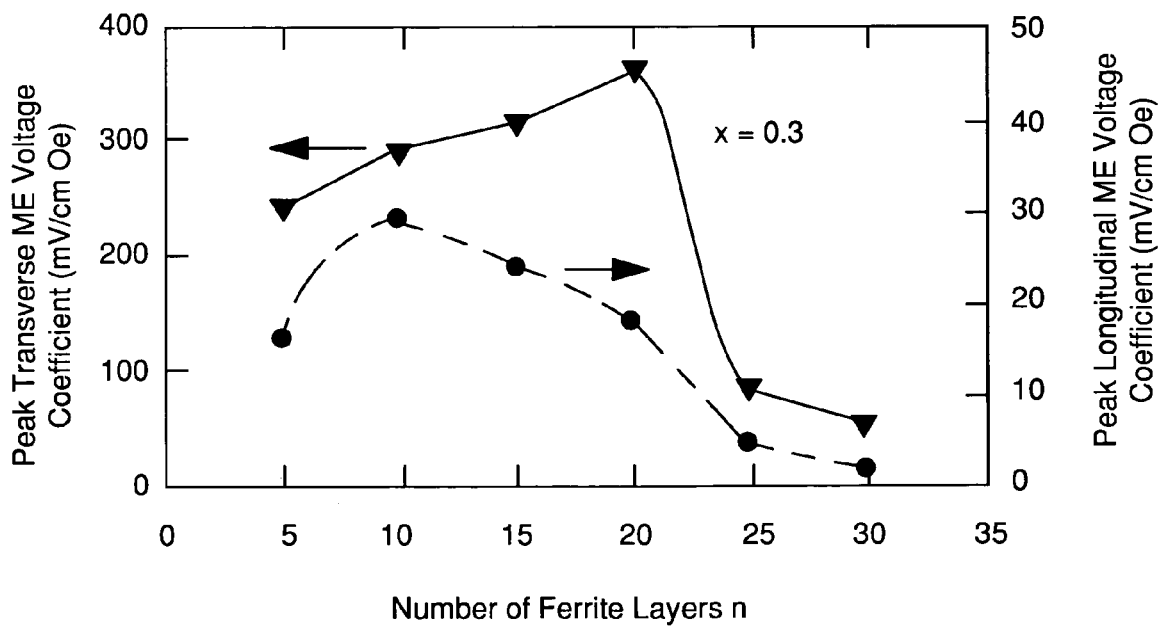
FIG. 15B shows the transverse (filled inverted triangles) and longitudinal (filled circles) ME voltage coefficients for NZFO(x=0.3)-PZT multilayers with n bimetal ferrite and n−1 PZT layers.

FIG. 15B shows the transverse (filled inverted triangles) and longitudinal (filled circles) ME voltage coefficients for NZFO(x=0.3)-PZT multilayers with n bimetal ferrite and n−1 PZT layers.

Figure 16A:
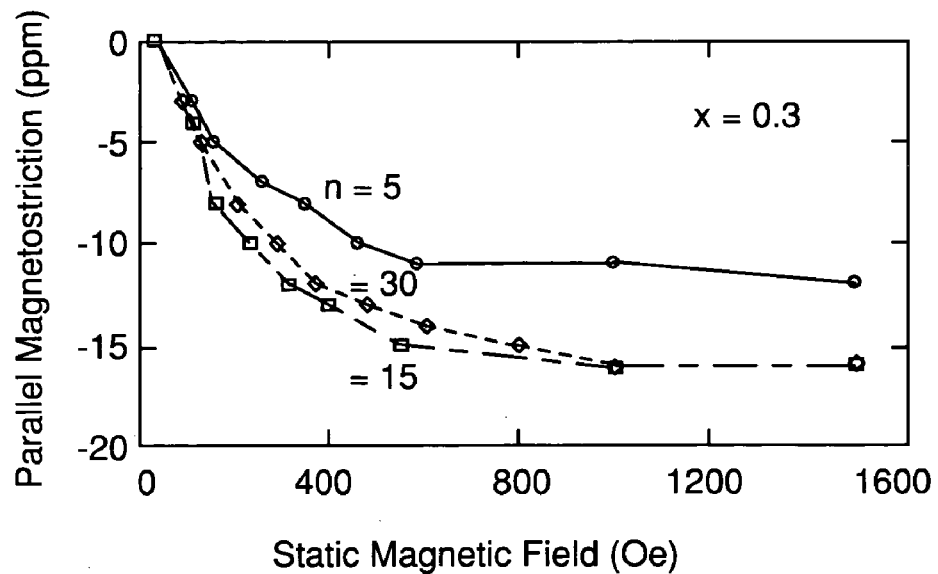
FIG. 16A shows parallel magnetostriction verses static magnetic field (Oe) NZFO(x=0.3)-PZT multilayers wherein n is the number of NZFO layers and n−1 is the number of PZT layers. The samples contained n ferrite and n−1 PZT layers with n=5 (circles), n=15 (squares), and n=30 (diamonds).

FIG. 16A shows parallel magnetostriction verses static magnetic field (Oe) NZFO(x=0.3)-PZT multilayers wherein n is the number of NZFO layers and n−1 is the number of PZT layers. The samples contained n ferrite and n−1 PZT layers with n=5 (circles), n=15 (squares), and n=30 (diamonds).

Figure 16B:
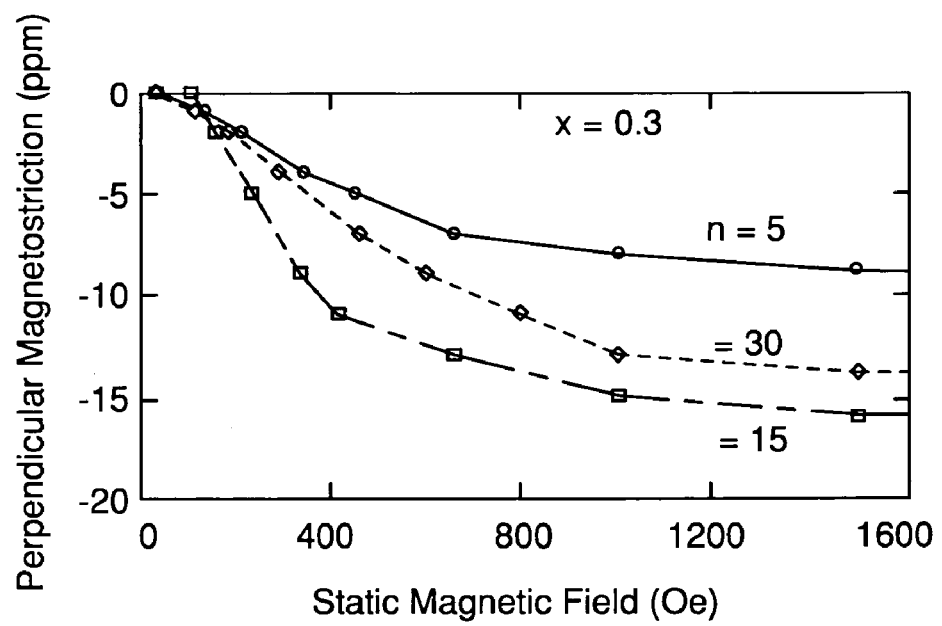
FIG. 16B shows perpendicular magnetostriction verses static magnetic field (Oe) for NZFO(x=0.3)-PZT multilayers wherein n is the number of NZFO layers and n−1 is the number of PZT layers. The samples contained n ferrite and n−1 PZT layers with n=5 (circles), n=15 (squares), and n=30 (diamonds).

FIG. 16B shows perpendicular magnetostriction verses static magnetic field (Oe) for NZFO(x=0.3)-PZT multilayers wherein n is the number of NZFO layers and n−1 is the number of PZT layers. The samples contained n ferrite and n−1 PZT layers with n=5 (circles), n=15 (squares), and n=30 (diamonds).

EXAMPLE 6

This example details two primary accomplishments of the nickel ferrite (NFO)-PZT composites: (i) observation of a record high ME coefficient $\alpha_E$, 460–1500 mV/cm Oe, in NFO-PZT bilayers and multilayers; and, (ii) a theoretical analysis that accounted very well for the volume and applied static magnetic-field dependence of $\alpha_E$.

Samples of NFO-PZT were synthesized by doctor-blade techniques. Magnetoelectric characterization involved measurements of transverse and longitudinal $\alpha_E$ as a function of bias magnetic field, frequency, temperature and volume fraction for the PE and MS-phases. The NFO-PZT samples had a transverse effect that was at least an order of magnitude larger than the longitudinal effect. The ME coefficient was maximum at room temperature. With increasing frequency, $\alpha_E$ was found to increase. An exponential increase in $\alpha_E$ occurred for increasing volume of the magnetostrictive phase in the multilayer.

The measured $\alpha_E$-values in NFO-PZT were the largest ever measured for any system. For comparison, the best $\alpha_E$ value for a single phase material was 20 mV/cm Oe for Cr$_2$O$_3$ (Astrov, Soviet Phys. JETP 13: 729 (1961); Rado and Folen, Phys. Rev. Lett. 7: 310 (1961); Foner and Hanabusa, J. Appl. Phys. 34: 1246 (1963)) and was 75 mV/cm Oe for multilayers of CoFe$_2$O$_4$ (CFO)-PZT (Harshe et al., Int. J. Appl. Electromagn. Mater. 4: 145 (1993); Avellaneda and Harshe, J. Intell. Mater. Syst. Struct. 5: 501 (1994)).

The main reasons for the high ME effects were (i) the choice of nickel ferrite that had a high pseudo-piezomagnetic effect and (ii) the existence of an ideal NFO-PZT interface as evident from the remarkable agreement between theory and data. In view of the fact that CFO-PZT composites had comparable material parameters, the interface played an important role in the dynamics of ferro-magnetic domain motion and the consequent stress mediated electromagnetic coupling. Anticipated impacts of the results herein are (i) studies directed at an understanding of the physics of the NFO-PZT interface, and (ii) interest in the composites for useful technologies.

The materials produced herein are useful for magnetoelectric memory devices, electrically controlled magnetic devices, magnetically controlled piezoelectric devices, and smart sensors (Wood and Austin, in *Proceedings of the Symposium on Magnetoelectric Interaction Phenomena in Crystals*, Seattle, 1973, edited by Freeman and Schmid (Gordon and Breach, New York, 1975), p. 181). In the following sections, details on the synthesis and magnetoelectric characterization of NFO-PZT bilayers and multilayers are provided. Theoretical estimates based on a model that assumes perfect interface bonding have been obtained for comparison with data.

I. SAMPLE PREPARATION

Both bilayers and multilayers of NFO-PZT were synthesized from thick films prepared by tape casting. The process involves (i) preparation of submicron-size powder of NFO and PZT, (ii) thick-film tapes by doctor-blade techniques, and (iii) lamination and sintering of bilayers and multilayers. Nickel ferrite powder obtained by standard ceramic techniques and commercial PZT (Sample No. APC850 purchased from American Piezo Ceramics, Inc., Mackeyville, Pa.) were used. For tape casting (Mistler and Twiname, *Tape Casting: Theory and Practice* (American Ceramics Society, Westerville, Ohio, 2000), powders of NFO or PZT were mixed with a solvent (ethyl alcohol) and a dispersant (Blown Menhaden fish oil) and ball milled for 24 hours, followed by a second ball milling with a plasticizer (butyl benzyl phthalate) and a binder (polyvinyl butyral) for 24 hours. The slurries thus obtained were cast into tapes on silicon-coated mylar sheets using a tape caster consisting of a pair of stationary micrometer-controlled blades and a moveable casting bed. It was possible to obtain 10×20 cm$^2$ tapes with the thickness in the range 10–200 μm. The tapes were arranged to obtain the desired structure, laminated under high pressure (3000–5000 psi) and high temperature (400 K), and heated at 1000 K for binder evaporation. The final sintering was carried out at 1400–1500 K.

Bilayers were made with 200-μm-thick films of NFO and PZT. Multilayers contained alternate layers of NFO and PZT, totaling n+1 layers of NFO and n layers of PZT (n=5–29), with a layer thickness of 10–20 μm. Structural studies were done with x-ray diffraction on multilayers, crushed power samples, and samples with exposed interface by etching away the top layer. There was no evidence for any impurity phases. Magnetic parameters such as the saturation magnetization, anisotropy, and g value were in agreement with values expected for nickel ferrite (Landolt-Börnstein: *Numerical Data and Functional Relationships in Science and Technology*, edited by Hellwege and Springer, Landolt-Börnstein, New Series, Group III, Vol. 4, Pt. 6 (Springer-Verlag, New York, 1970). Thus the high temperature processing did not result in any impurity phases or degradation of the quality of the magnetic phase.

The magnetostriction λ is an important parameter for theoretical estimates of $\alpha_E$ for the composite. In the ferromagnetic phase, the magnetostriction due an ac field δH in the presence of a bias field H leads to pseudo-piezomagnetic effects that in turn give rise to the necessary coupling to the piezoelectric phase in the composite. In order to maximize the ME coefficient, H must correspond to the maximum in the slope of λ vs H characteristics. The standard strain-gauge method (Micro-Measurement Group Strain Indicator-Model 3800 and series WK strain gauges) and an electromagnet with a maximum field of 5 kOe were used for the measurement of λ. FIG. 1 shows the static field H dependence of parallel ($\lambda_{11}$) and perpendicular ($\lambda_{13}$) magnetostriction, corresponding to H parallel or perpendicular to the sample plane. (A three-dimensional coordinate system (1,2,3) with the sample in the (1,2) plane was assumed). The room temperature data were for a multilayer with n=14 and a layer thickness of 14 μm. The parallel magnetostriction $\lambda_{11}$ is negative (the Figure shows the magnitude) and was a factor of 3–10 larger than $\lambda_{13}$. One observes saturation of λ for H values above 1200 Oe. No dependence of λ either on the number of layers or on the layer thickness was observed.

Samples were then polished, electrical contacts were made with silver paint, and poled. The poling procedure involved heating the sample to 420 K and the application of an electric field E of 20 kV/cm. As the sample was cooled to 300 K, E was increased progressively to 50 kV/cm over a duration of 30 min. The dielectric constant for the composite was in agreement with the expected values for PZT (*Piezoelectric Ceramics Materials Properties* (American Piezo Ceramics, Inc., Mackeyville, Pa., 1998). The piezoelectric coefficient, another important parameter for the piezoelectric phase and the composite, measured with a (Pennebaker-Model 8000) $d_{33}$ tester was in the range 70–170 pm/V.

II. MAGNETOELECTRIC EFFECTS

The parameter of importance for the multilayers is the magnetoelectric voltage coefficient $\alpha_E$. Magnetoelectric measurements are usually performed under two distinctly different conditions: (i) the induced magnetization is measured for an applied electric effect or (ii) the induced polarization is obtained for an applied magnetic field. The electric field produced by an alternating magnetic field applied to the composite was measured. A set up in which the sample was subjected to a bias field H (with the use of an electromagnet) and an ac field δH (1 Oe at 10 Hz–1 kHz) produced by a pair of Helmholtz coils was used. The sample was shielded from stray electric fields. Lock-in detection was implemented for accurate determination of $\alpha_E$ for two different field orientations: (i) transverse $\alpha_E$ or $\alpha_{E3,1}$ for H and δH parallel to each other and to sample plane, and δE measured perpendicular to the sample plane and (ii) longitudinal $\alpha_{E3,3}$ for all the three fields parallel to each other and perpendicular to the sample plane. A liquid-helium glass Dewar and a nonmetallic sample insert were used for studies on temperature dependence of ME effects.

Figure 17:
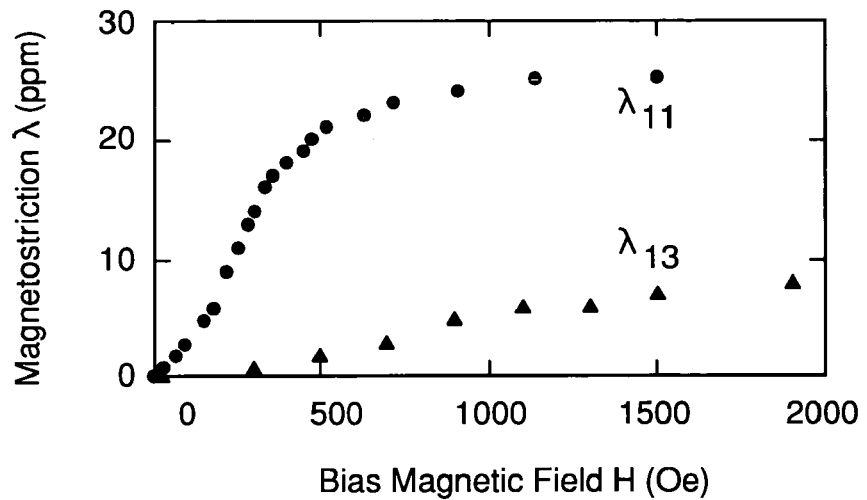
FIG. 17 shows the bias magnetic field H dependence of the magnetostriction for a multilayer composite of nickel ferrite (NFO) and lead zirconate titanate (PZT). The sample contained n+1 layers of NFO and n layers of PZT, with n=14 and a layer thickness of 14 µm. The data at room temperature are for H parallel ($\lambda_{11}$) (circles) and perpendicular ($\lambda_{13}$) (triangles) to the plane of the multilayer composite, and are used for theoretical estimates of magnetoelectric-voltage coefficient. $\lambda_{11}$ is negative, but the Figure shows the magnitude.
Figure 18:
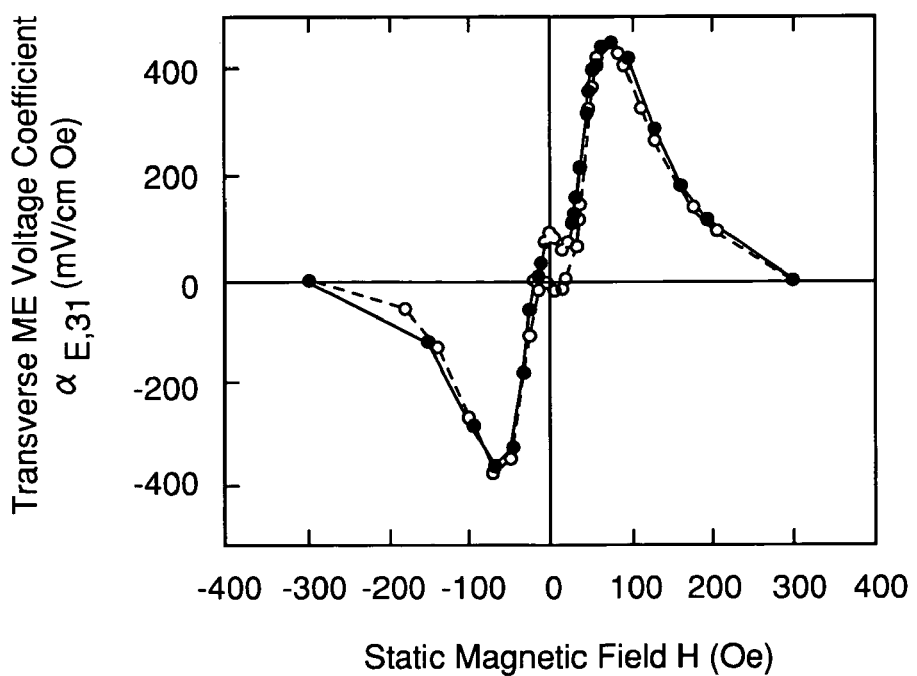
FIG. 18 shows the transverse magnetoelectric (ME) voltage coefficient $\alpha_{E,31}=\delta E_3/\delta H_1$ at room temperature as a function of static magnetic field H for a two-layer structure consisting of 200-µm films of NFO and PZT. The field H and the 1-kHz ac magnetic field $\delta H_1$ are applied parallel to each other and parallel to the sample plane and the induced electric field $\delta E_3$ is measured perpendicular to the sample plane. The open (filled) circles are data points for increasing (decreasing) H. The lines are guides to the eye.

FIG. 18 shows the static magnetic-field dependence of the transverse ME coefficient $\alpha_{E,31}$, for a two-layer composite of NFO-PZT, each layer with a thickness of 200 μm. The data at room temperature were for a frequency of 1 kHz and for unit thickness of the piezoelectric phase. As H was increased from zero, $\alpha_{E,31}$ increases, reached a maximum value of 460 mV/cm Oe at 70 Oe, and then dropped rapidly to zero above 300 Oe. There was no evidence for hysteresis in FIG. 18 except at fields close to zero. A phase difference of 180° between the induced voltages for +H and −H was observed. As discussed later, the magnitude and the field dependence in FIG. 18 are related to the slope of λ vs H characteristics in FIG. 17 and can be understood in terms of pseudo-piezomagnetic effects in nickel ferrite.

Figure 19:
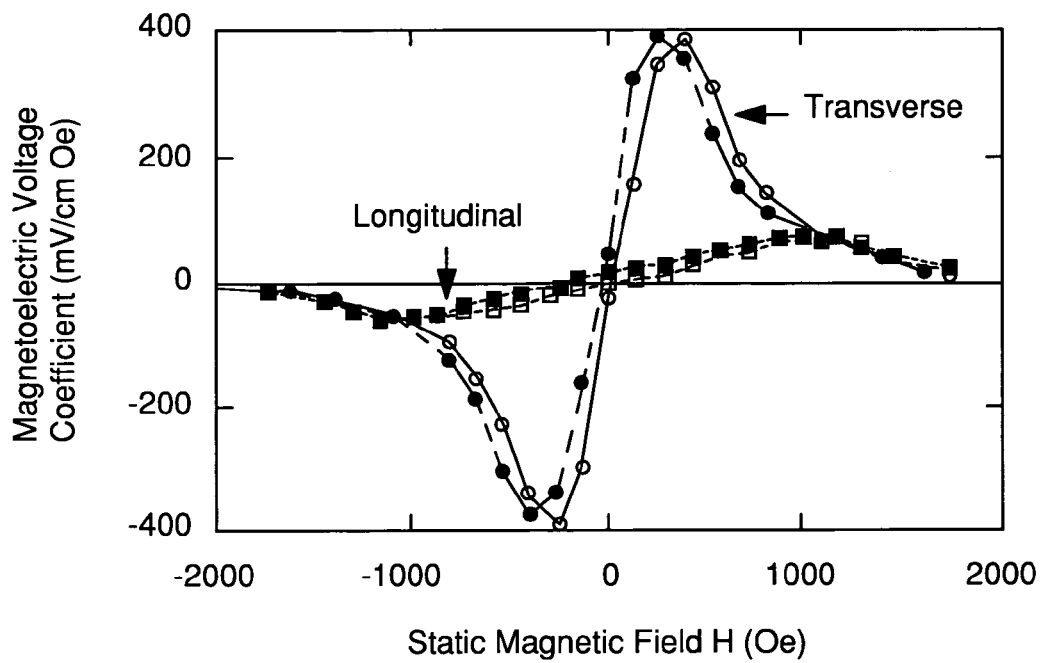
FIG. 19 shows the static-field dependence of room-temperature transverse and longitudinal ME voltage coefficients, $\alpha_{E,31}$ and $\alpha_{E,33}$, respectively, for a multilayer composite with n=14. The thickness of each layer is 14 µm. For longitudinal ME effects, the fields H, $\delta H$ (1 kHz), and $\delta E$ are parallel to each other and perpendicular to the sample plane. The open (filled) circles are data points for increasing (decreasing) H. The lines are guides to the eye.

Similar field dependence of both the transverse and longitudinal ME voltage coefficients, $\alpha_{E,31}$ and $\alpha_{E,33}$ respectively, are shown in FIG. 19 for a multilayer composite. The data at room temperature for a 1 kHz ac field were for a sample consisting of alternate layers of NFO and PZT, each layer with a thickness of 14 μm so that the effective thickness of PZT was the same as for the bilayer.

A comparison of data in FIGS. 18 and 19 indicated the following. In multilayers, (i) ME effects were observed over a wider field range, (ii) the field for maximum $\alpha_{E,31}$ was shifted to higher fields, and (iii) the peak value of $\alpha_{E,31}$ was 15% smaller than for the bilayer. FIG. 19 shows a noticeable hysteresis in the field dependence of $\alpha_{E,31}$ and $\alpha_{E,33}$. The variation of $\alpha_{E,33}$ with H was linear up to 1000 Oe, and the longitudinal ME effect was almost an order of magnitude weaker than the transverse effect.

Figure 20A:
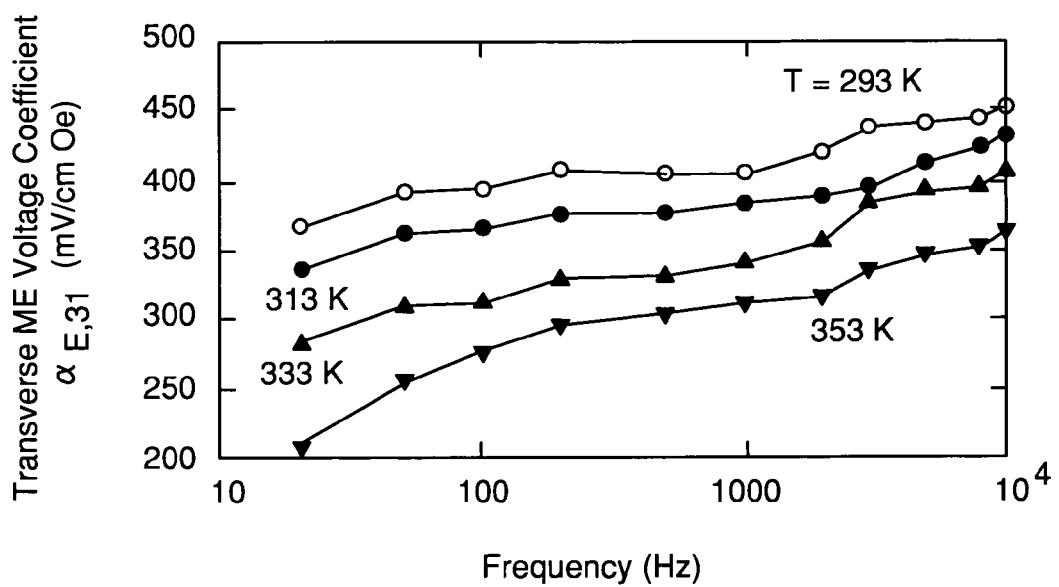
FIG. 20A shows the frequency dependence of the transverse coefficient $\alpha_{E,31}$ for the multilayer with n=14 at various temperatures (T=degrees kelvin (K)). The lines are guides to the eye. Values of $\alpha_{E,31}$ are for the bias field H corresponding to maximum value in the ME effect. The Figure shows the frequency dependence at T=293K (open circles), T=313K (filled circles), T=333K (filled triangles), and T=353K (filled inverted triangles).
Figure 20B:
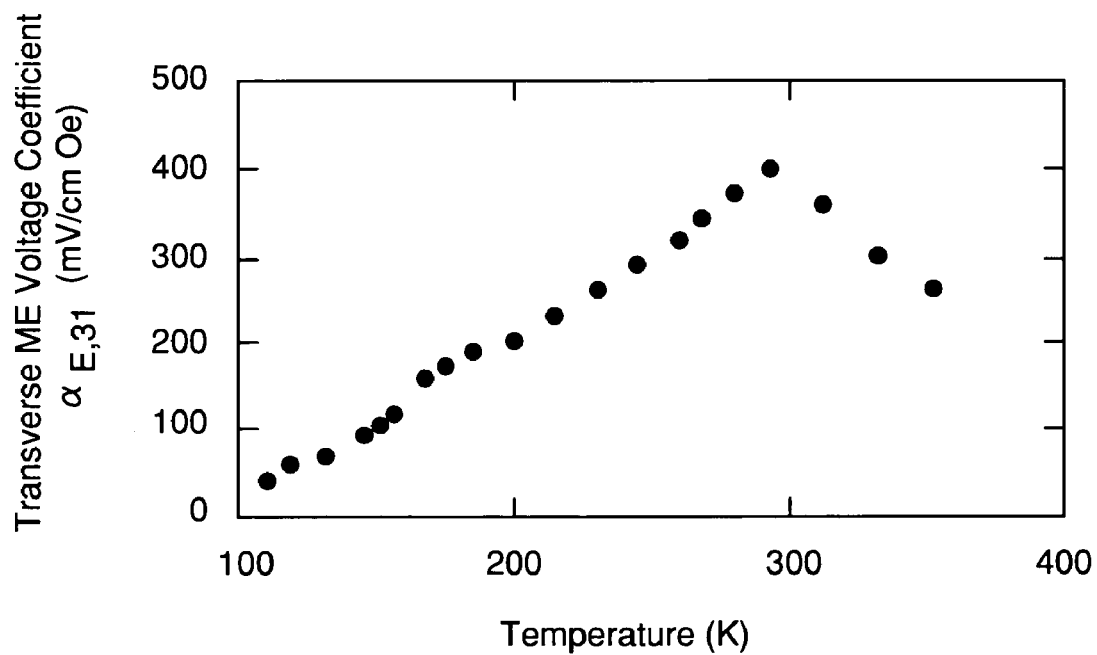
FIG. 20B shows the temperature dependence of the transverse coefficient $\alpha_{E,31}$ for the multilayer with n=14. The lines are guides to the eye. Values of $\alpha_{E,31}$ are for the bias field H corresponding to maximum value in the ME effect. The temperature dependence is for a frequency of 100 Hz.

The variation of the multilayer $\alpha_{E,31}$ with frequency and temperature are shown in FIGS. 20A and 20B. Upon increasing the frequency from 20 Hz to 10 kHz, there was an overall increase of 25% in the ME voltage coefficient, but a substantial fraction of the increase occurred over the 1–10 kHz range (except at 353 K). These variations were most likely due to frequency dependence of the dielectric constant for the constituent phases and the piezoelectric coefficient for PZT.

Data on temperature dependence of $\alpha_{E,31}$ at 100 Hz are shown in FIGS. 20A and 20B. A peak in $\alpha_{E,31}$ was observed at room temperature and it decreased when T was either increased or decreased from room temperature. Detailed temperature dependence of material parameters for both phases was necessary for an understanding of these results.

Figure 21:
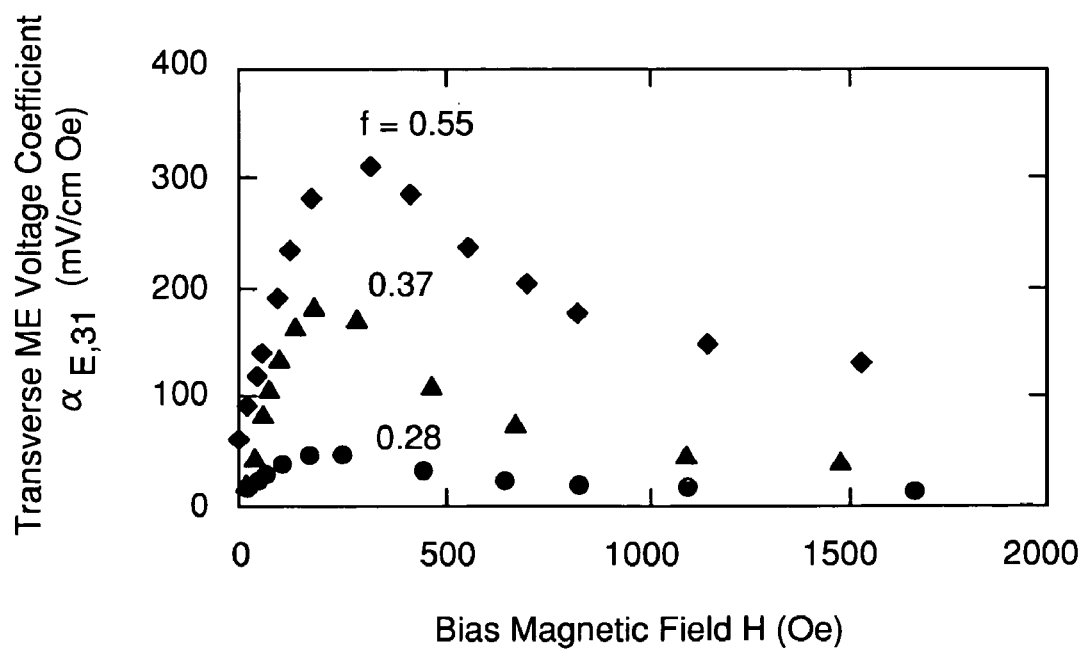
FIG. 21 shows room temperature $\alpha_{E,31}$ at 100 Hz as a function of H for multilayers with n=10. The thickness of NFO and PZT layers was controlled to obtain a series of volume ratios of the magnetostrictive ($v_m$) to piezoelectric ($v_p$) phases, $f=v_m/v_p=0.22-5.5$. The data are for f=0.28 (circles), 0.37 (triangles), and 0.55 (diamonds).
Figure 22:
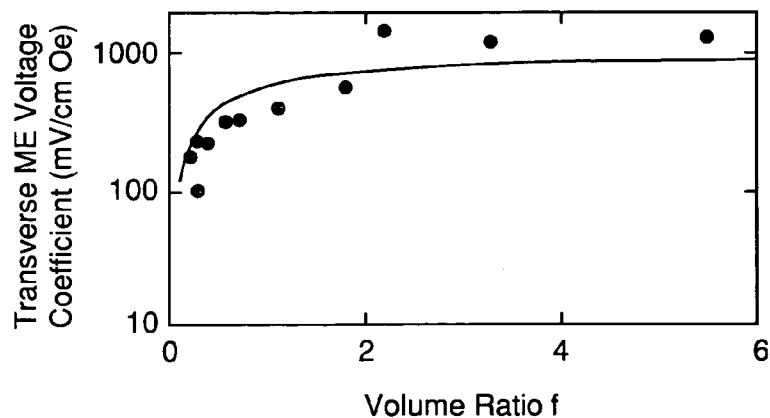
FIG. 22 shows the variation of the transverse coefficient $\alpha_{E,31}$ with volume ratio $f=v_m/v_p$, for the multilayer. The solid line represents theoretical values for a two-layer structure. The values of $\alpha_{E,31}$ are for bias field H corresponding to maximum value in the ME effect and for a frequency of 100 Hz.

According to a theoretical model to be discussed in the following section, $\alpha_E$ was expected to be dependent sensitively on the ratio of volumes of the magnetostrictive (m) and piezoelectric (p) phases, $f=v_m/v_p$. Data was obtained on such dependence in multilayers of nickel ferrite (with a small substitution of Zinc for Ni)-PZT. Studies were performed on multilayers with n=10 and a series of layer thicknesses to obtain samples with the necessary volume fractions. FIG. 21 shows the H dependence of $\alpha_{E,31}$ on f values. The observed features were similar to the field dependence in FIG. 19. With increasing f, a rapid increase in $\alpha_{E,31}$ was evident in FIG. 21. Another observation of importance was the up-shift in the bias magnetic field corresponding to maximum $\alpha_{E,31}$ with increasing f. FIG. 22 shows the variation of the peak value of $\alpha_{E,31}$ with f. There was an exponential increase in $\alpha_{E,31}$ as the volume of the magnetostrictive component was increased and it leveled at high volumes. The data indicated more than an order of magnitude increase in $\alpha_E$ as f was increased from 0.2 to 5.5 and a maximum of 1500 mV/cm Oe was obtained for f=2.2.

The most significant results in FIGS. 18 to 22 were that (i) for equal volume of MS and FE phases, the maximum $\alpha_{E,31}$ ranged from 400 mV/cm Oe in multilayers to 460 mV/cm Oe in the bilayer and (ii) $\alpha_{E,31}$ increased with increasing volume of nickel ferrite and the largest measured value was 1500 mV/cm Oe for $v_m/v_p$=2.2. These values must be compared with 20 mV/cm Oe for $Cr_2O_3$, the prior art best single-phase ME material (Astrov, Soviet Phys. JETP 13: 729 (1961); Rado and Folen, Phys. Rev. Lett. 7: 310 (1961); Foner and Hanabusa, J. Appl. Phys. 34: 1246 (1963)). The values herein were more than an order of magnitude higher than reported values for ferrite-$BaTiO_3$ bulk composites (Van den Boomgaard et al., J. Mater. Sci. 9: 1705 (1974); Van den Boomgaard et al., Ferroelectrics 14: 727 (1976); Van den Boomgaard and Born, J. Mater. Sci. 13: 1538 (1978)) and multilayers of CFO-PZT (Harshe et al., Int. J. Appl. Electromagn. Mater. 4: 145 (1993); Avellaneda and Harshe, J. Intell. Mater. Syst. Struct. 5: 501 (1994); Harshe, Ph.D. thesis, Pennsylvania State University, 1991) and a factor of 5 larger than that in laminated composites of Ni(Co,Cu)—Mn ferrite-PZT (Lupeiko et al., Inorg. Mater. (Transl. of Neorg. Mater.) 31: 1245 (1995)).

III. DISCUSSION

First a theoretical model for the bilayers and estimate the bias magnetic field and volume-fraction dependence of the magnetoelectric voltage coefficients for comparison with data is discussed. Following this, the possible cause of the large ME effect in NFO-PZT structures is discussed. Harshe and co-workers provided a model for a two-layer structure in which no electric field is present in the MS layer, the top and bottom surfaces of the piezoelectric (PE) layers are equipotential surfaces, and the bias magnetic field H is uniform throughout the sample (Harshe et al., Int. J. Appl. Electromagn. Mater. 4: 145 (1993); Avellaneda and Harshe, J. Intell. Mater. Syst. Struct. 5: 501 (1994)). For the composite of interest, NFO-PZT, the assumptions are justified because of low electrical resistivity for NFO compared to PZT. The total strain at the interface is given by the expression $$S = sT + dE + qH. \tag{3}$$

The three terms correspond to contributions from elastic (s compliance coefficient; T, stress tensor), piezoelectric (d, piezoelectric coefficient), and pseudopiezomagnetic effects (q, piezomagnetic coefficient). Although strain due to magnetostriction is $\lambda H^2$, under appropriate bias field a linear pseudopiezomagnetic is expected resulting in a strain qH. The ME coefficient $\alpha_E$ is estimated by the following procedure: (i) for an applied magnetic field δH, the total strain at the interface, which is the sum of elastic and magnetostrictive strains, is estimated; (ii) the strain-stress relationship is calculated for boundary conditions at the interface; and, (iii) the stress-electric field (δE) relationship is estimated for appropriate boundary conditions. We are interested in a free body with a perfectly bonded interface. Denoting the magnetostrictive and the piezoelectric phases by m and p, respectively, one obtains for the transverse ME coefficient $$\alpha_{E,31} = \delta E_3/\delta H_1 = -2d^p{}_{31}q^m{}_{11}v_m(s^m{}_{11}+s^m{}_{12})\epsilon^{T,p}{}_{33}v_p + (s^p{}_{11}+s^p{}_{12})\epsilon^{T,p}{}_{33}v_m - 2(d^p{}_{31})^2 v_m \tag{5}$$

and the longitudinal coefficient $$\alpha_{E,33} = \delta E_3/\delta H_3 = -2d^p{}_{31}q^m{}_{11}v_m(s^m{}_{11}+s^m{}_{12})\epsilon^{T,p}{}_{33}v_p + (s^p{}_{11}+s^p{}_{12})\epsilon^{T,p}{}_{33}v_m - 2(d^p{}_{31})^2 v_m \tag{6}$$

Here u denotes the volume and $\epsilon^T$ is the permittivity at constant stress. Since the ME voltage is induced in the PE phase, Equations (4) and (5) are expressions for per unit thickness of the PE phase. It is clear from Equations (4) and (5) that $\alpha_E$ is directly proportional to the product of piezomagnetic and piezoelectric coefficients, and is dependent on the volume fraction $v_m/v_p$.

The above model was used for the theoretical calculation of $\alpha_E$ for comparison with the data. The following material parameters were used for the constituent phases (Harshe, Ph.D. thesis, Pennsylvania State University, 1991; Landolt-Börnstein: *Numerical Data and Functional Relationships in Science and Technology*, edited by Hellwege and Springer, Landolt-Börnstein, New Series, Group III, Vol. 4, Pt. 6 (Springer-Verlag, New York, 1970; *Piezoelectric Ceramics Materials Properties* (American Piezo Ceramics, Inc., Mackeyville, Pa., 1998).

| PZ, | $s^P_{11} = 14 \times 10^{-12}$ m²/N | NiFe₂O₄, | $s^m_{11} = 6.5 \times 10^{-12}$ m²/N |
|---|---|---|---|
| | $s^P_{11} = -8 \times 10^{-12}$ m²/N | | $s^m_{12} = -2.4 \times 10^{-12}$ m²/N |
| | $\epsilon^{T,P}_{33} = 17 \times 10^{-9}$ F/m | | |

Measured values of the piezoelectric coupling coefficient δhd 33 for the multilayers ranged from 70–170 pm/V at 100 Hz and all average value of $d_{31}=d_{33}/2=60$ pm/V was used. The other required parameter, $q=\delta\lambda/\delta H$ was determined from parallel ($\lambda_{11}$) and perpendicular ($\lambda_{13}$) magnetostriction data in FIG. 17. Theoretical values (The SI unit for ME voltage coefficient, (V/m)/A/m)+0.8 V/cm Oe) of $\alpha_{E,33}$ and $\alpha_{E,31}$ were estimated from Eqs. (4) and (5).

Figure 23A:
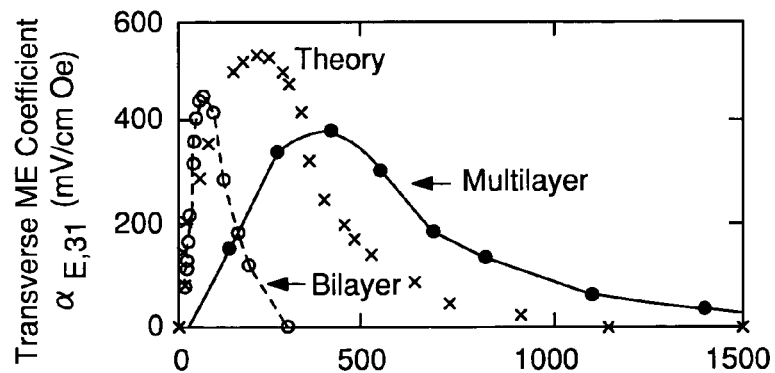
FIG. 23A shows a comparison of H dependence of theoretical transverse ME coefficients estimated for a simple two-layer NFO-PZT structure with the data for the bilayer and multilayer composites in FIGS. 18 and 19. The open (filled) circles are data points for the bilayer (multilayer). The crosses are the theoretical values estimated using Equations (4) and (5), $v_m/v_p=1$, material parameters given in Example 6, and the slope $\delta\lambda/\delta H$ of magnetostriction $\lambda$ vs H data in FIG. 17.
Figure 23B:
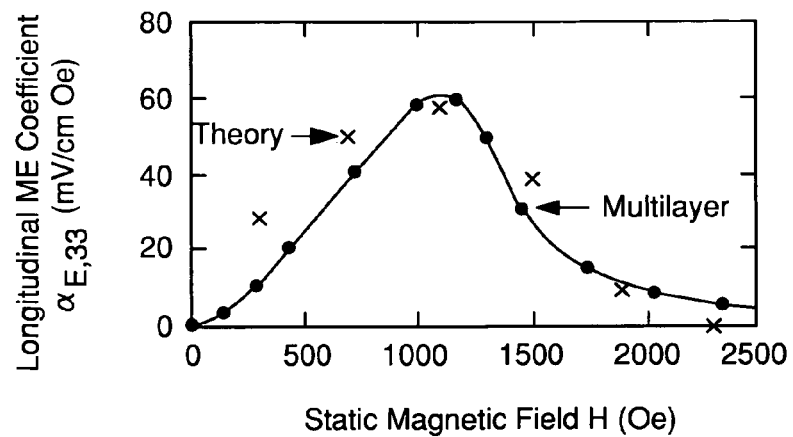
FIG. 23B shows a comparison of H dependence of theoretical longitudinal ME coefficients estimated for a simple two-layer NFO-PZT structure with the data for the bilayer and multilayer composites in FIGS. 18 and 19. The open (filled) circles are data points for the bilayer (multilayer). The crosses are the theoretical values estimated using Equations (4) and (5), $v_m/v_p=1$, material parameters given in Example 17, and the slope $\delta\lambda/\delta H$ of magnetostriction $\lambda$ vs H data in FIG. 17.

In FIGS. 23A and 23B, calculated transverse and longitudinal ME voltage coefficients for $v_m/v_p=1$ were compared with the data for the bilayer and multilayer (in FIGS. 18 and 19). There was overall agreement for both the magnitude and field dependence. Recall that $\alpha_E$ is frequency dependent and the agreement between theory and data improves at high frequencies since $\alpha_E$ values are 15% higher at 10 kHz than at 1 kHz. The H dependence of $\alpha_E$ essentially tracked the slope of $\lambda$ vs H. Once the magnetostriction attained the saturation value, the loss of pseudopiezomagnetic coupling led to the absence of ME effects. It is clear from FIGS. 23A and 23B that for the bilayer there was good agreement between low-field data and theory. However, it was necessary to explore the reason for the rapid drop in $\alpha_{E,31}$ at high fields. For the multilayer, (i) the expected order of magnitude difference in $\alpha_{E,31}$ and $\alpha_{E,33}$ agreed with the data, (ii) the estimated H value corresponding to maximum in $\alpha_{E,31}$ was smaller than observed experimentally, and (iii) there was exceptionally good agreement between theory and data for the longitudinal coefficient $\alpha_{E,33}$.

Theoretical values of the transverse ME coefficient are shown in FIG. 22 as a function of the volume of the constituent phases and there was good agreement with the data. Increase in the volume of the MS phase leads to an enhancement in the strain due to magnetostriction and an increase in the ME coefficient. Our recent theoretical modeling of the reciprocal effect, i.e., shift in the ferromagnetic resonance field of the MS phase due to piezoelectric effects in the PE-phase, indicates increasing resonance-field shift with increasing volume of the PE phase (Bichurin et al., Phys. Rev. B 64: 094409 (2001)). Thus, although the theory is based on a simple two-layer structure, it accounts very well for both the magnitude and volume and H dependence.

Next to be addressed was what caused the large ME effects in NFO-PZT. The large $\alpha_{E,31}$ was in part due to inherent advantages in ML geometry: efficient poling and the total absence of leakage currents. But other systems such as CFO-PZT also have the same advantages. In ferrites, domains are spontaneously deformed in the magnetization direction and the Joule magnetostriction is caused by domain-wall motion and domain rotation in the presence of H. Since ME effects involve dynamic magnetoelastic coupling, key requirements for the ferrite phase are unimpeded domain motion and a large $\lambda$. A soft, high initial permeability (low coercivity), and high-$\lambda$ ferrite, such as NFO used here, was the main ingredient for strong ME effects. In magnetically hard cobalt ferrite, however, there is the disadvantage of a large coercive field that limits domain rotation. Since the ME effect originates at the interface, it is important to consider the influence of growth-induced stress and its effect on magnetic anisotropy and the dynamics of domain motion. The interface coupling is also influenced by a variety of other factors such as defects, inhomogeneities, and grain boundaries that pin the domain and limit wall motion and rotation. Important factors that affect the interface properties during the high-temperature processing are the thermal-expansion coefficients (2 ppm for PZT vs 10 ppm for most ferrites), thermal conductivity (an order of magnitude higher in CFO compared to PZT or NFO) (Landolt-Börnstein: *Numerical Data and Functional Relationships in Science and Technology*, edited by Hellwege and Springer, Landolt-Börnstein, New Series, Group III, Vol. 4, Pt. 6 (Springer-Verlag, New York, 1970; *Piezoelectric Ceramics Materials Properties* (American Piezo Ceramics, Inc., Mackeyville, Pa., 1998)), and the sintering temperature. Differential thermal expansion and thermal conductivity could result in built-in strain and interface micro-cracks. The sintering temperature of 1425–1500 K is much closer to the melting temperature of cobalt ferrite (1840 K) than NFO (2020 K) and it is quite likely that the highly reactive lead compound (PZT) could easily form both structural and chemical inhomogeneities at the interface with cobalt ferrite (Landolt-Börnstein: *Numerical Data and Functional Relationships in Science and Technology*, edited by Hellwege and Springer, Landolt-Börnstein, New Series, Group III, Vol. 4, Pt. 6 (Springer-Verlag, New York, 1970). Studies show extensive microcracks and loss of Fe from the ferrite in bulk composites of CFO—BaTiO₃ (Van den Boomgaard et al., J. Mater. Sci. 9: 1705 (194); Van den Boomgaard et al., Ferroelectrics 14: 727 (1976)). So it is reasonable to conclude that the giant ME effect in NFO-PZT is most likely due to an interface free of growth-induced stress or defects and a favorable domain dynamics. Investigations on the microscopic nature of the NFO-PZT interface with techniques such as high-resolution X-ray diffraction, electron microscopy, and magnetic-force microcopy are critically important for an understanding of the current observations.

IV. CONCLUSION

Thick-film bilayers and multilayers of nickel ferrite-PZT prepared by tape-casting techniques showed the strongest magnetoelectric effects reported to date in any system. The effect was of the same strength in bilayers and multilayers for the same effective thickness of the constituent phases. A general increase in $\alpha_E$ was observed with increasing volume of the magnetostrictive phase. A theoretical model that assumed ideal interface conditions accounted very well for the magnitude, and volume and field dependence of ME parameters and; therefore, implied a perfectly bonded defect-free interface. The field-conversion efficiency for the composite was well within the range needed for practical applications.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the claims attached herein.

I claim:

1. In a method for forming a magnetoelectric composite wherein a combination of a piezoelectric composition and a magnetostrictive composition are joined together as a laminate in alternate separate layers to provide a bilayers or multilayers, the improvement which comprises:
   (a) providing a first layer of a bimetal ferrite powder mixed with a first binder with a thickness between 10 and 200 µm, wherein zinc is one of the metals, as the magnetostrictive composition;
   (b) forming a combination of the first layer of step (a) with a second layer of a powder of a piezoelectric material mixed with a second binder with a thickness between 10 to 200 µm in the separate layers; and
   (c) compressing and sintering the combination of step (b) to form the magnetoelectric composite, wherein the compression of the first and second layer is between about 3000 and 5000 psi to provide green laminated bilayers or multilayers which are heated to 1050 to 1200° C. to evaporate the binder and then finally sintered at about 400 to 1500° K, wherein the piezoelectric material of the first layer of composite is electrically poled and the composite has a magnetoelectric voltage coefficient of at least 100 mV/cm Oe measured at a frequency of 100 Hz at room temperature.

2. The method of claim 1 wherein the piezoelectric material is selected from the group consisting of lead zirconate titanate (PZT), lead zincate niobate (PZN), lead zincate niobate lead-titanate (PZN-PT), lead magnesium niobate lead-titanate (PMN-PT), lead lanthanum zirconate titanate (PLZT), Nb/Ta doped-PLZT, and barium zirconate titanate (BZT).

3. The method of claims 1 or 2 wherein the bimetal ferrite has the formula:

$$Co_{1-x}Zn_xFe_2O_4$$

where x is 0.2 to 0.5.

4. The method of claims 1 or 2 wherein the bimetal ferrite has the formula $$Ni_{1-x}Zn_xFe_2O_4$$

where x is 0.1 to 0.5.

5. The method of claims 1 or 2 wherein the bimetal ferrite has the formula:

$$Li_{0.5-x/2}Zn_xFe_{2.5-x/2}O_4$$

where x is 0.1 to 0.4.

* * * * *

UNITED STATES PATENT AND TRADEMARK OFFICE
CERTIFICATE OF CORRECTION

PATENT NO.         : 7,201,817 B2
APPLICATION NO. : 10/940139
DATED              : April 10, 2007
INVENTOR(S)        : Gopalan Srinivasan It is certified that error appears in the above-identified patent and that said Letters Patent is hereby corrected as shown below:

Column 4, line 5, "where x is 02. to 0.5" should be --where x is 0.2 to 0.5--.

Column 12, line 25, "Contacts to the can be made" should be --Contacts can be made--.

Column 28, line 64, "Here u denotes the volume" should be --Here v denotes the volume--.

Column 29, line 22, "δhd 33" should be --$\delta_{33}$--

Column 31, line 28, "400-1500" should be --1400-1500--.

Signed and Sealed this

Eighteenth Day of September, 2007

JON W. DUDAS
*Director of the United States Patent and Trademark Office*